US010984883B1

(12) United States Patent
Tungala et al.

(10) Patent No.: US 10,984,883 B1
(45) Date of Patent: Apr. 20, 2021

(54) SYSTEMS AND METHODS FOR CAPACITY MANAGEMENT OF A MEMORY SYSTEM

(71) Applicant: SanDisk Technologies LLC, Addison, TX (US)

(72) Inventors: Sowjanya Tungala, Karnataka (IN); Sini Balakrishnan, Karnataka (IN); Sowjanya Sunkavelli, Karnataka (IN); Sridhar Yadala, Karnataka (IN); Dat Tran, San Jose, CA (US); Loc Tu, San Jose, CA (US); Kirubakaran Periyannan, San Jose, CA (US)

(73) Assignee: SanDiskTechnologies LLC, Addison, TX (US)

( * ) Notice: Subject to any disclaimer, the term of this patent is extended or adjusted under 35 U.S.C. 154(b) by 0 days.

(21) Appl. No.: 16/728,447

(22) Filed: Dec. 27, 2019

(51) Int. Cl.
*G11C 29/44* (2006.01)
*G11C 29/00* (2006.01)
*G11C 29/18* (2006.01)

(52) U.S. Cl.
CPC .............. *G11C 29/44* (2013.01); *G11C 29/18* (2013.01); *G11C 29/832* (2013.01); *G11C 2029/1806* (2013.01)

(58) Field of Classification Search
CPC ....... G11C 29/44; G11C 29/832; G11C 29/18; G11C 2029/1806
See application file for complete search history.

(56) References Cited

U.S. PATENT DOCUMENTS

| 7,277,307 | B1* | 10/2007 | Yelluru | G11C 15/04 365/189.07 |
| 2002/0184557 | A1* | 12/2002 | Hughes | G11C 29/848 714/6.13 |
| 2005/0057961 | A1* | 3/2005 | Ahmad | G11C 29/804 365/154 |
| 2013/0329494 | A1* | 12/2013 | Shirakawa | G11C 29/808 365/185.09 |

* cited by examiner

Primary Examiner — Ajay Ojha
(74) Attorney, Agent, or Firm — Dickinson Wright PLLC; Steven Hurles

(57) ABSTRACT

A memory management method includes identifying memory segments of a memory device. The method also includes identifying, for each memory segment, a number of faulty columns and determining a total number of faulty columns for the memory device. The method also includes, in response to a determination that the total number of faulty columns is greater than a threshold, identifying a memory segment having a highest number of faulty columns. The method also includes disabling the memory segment. Another method includes identifying, for each memory segment, a number of faulty memory blocks and determining a total number of faulty memory blocks. The method also includes, in response to a determination that the total number of faulty memory blocks is greater than a threshold, identifying a memory segment having a highest number of faulty memory blocks. The method also includes disabling the memory segment.

20 Claims, 26 Drawing Sheets

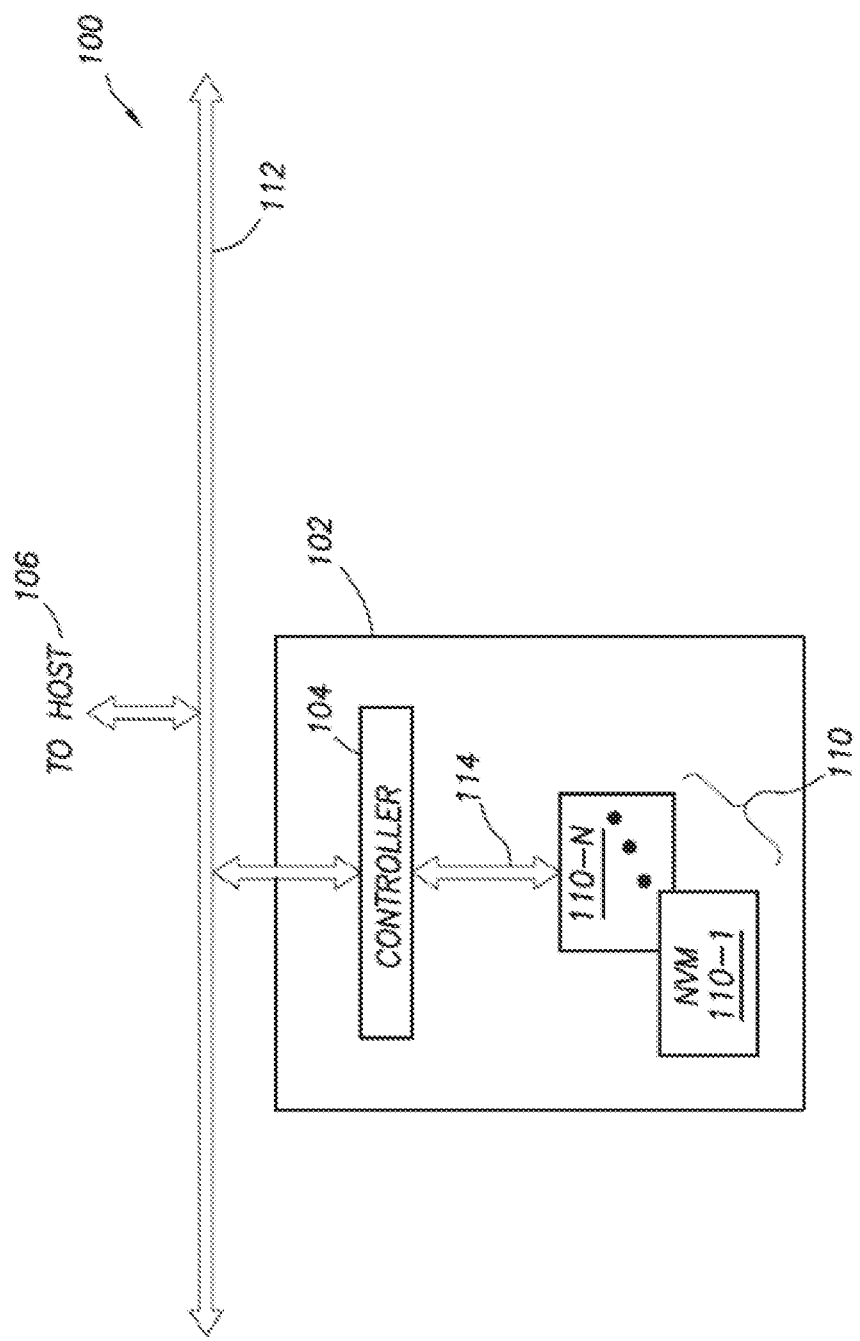

600

16 KB PAGE SIZE

| WL | 0000h | 0800h | 1000h | 1800h | 2000h |
|---|---|---|---|---|---|
| WL M → | DA00 (4kB) | DA01 (4kB) | DA02 (4kB) | DA03 (4kB) | |
| WL N → | DA00 (4kB) | DA01 (4kB) | DA02 (4kB) | DA03 (4kB) | |
| WL O → | DA00 (4kB) | DA01 (4kB) | DA02 (4kB) | DA03 (4kB) | |
| WL P → | DA00 (4kB) | DA01 (4kB) | DA02 (4kB) | DA03 (4kB) | |

12 KB PAGE SIZE

| WL | 0000h | 0800h | 1000h | 1800h |
|---|---|---|---|---|
| WL M → | DA00 (4kB) | DA01 (4kB) | DA02 (4kB) | |
| WL N → | DA00 (4kB) | DA01 (4kB) | DA02 (4kB) | |
| WL O → | DA00 (4kB) | DA01 (4kB) | DA02 (4kB) | |
| WL P → | DA00 (4kB) | DA01 (4kB) | DA02 (4kB) | |

8 KB PAGE SIZE

| WL | 0000h | 0800h | 1000h |
|---|---|---|---|
| WL M → | DA00 (4kB) | DA01 (4kB) | |
| WL N → | DA02 (4kB) | DA03 (4kB) | |
| WL O → | DA00 (4kB) | DA01 (4kB) | |
| WL P → | DA02 (4kB) | DA03 (4kB) | |

4 KB PAGE SIZE

| WL | 0000h | 0800h |
|---|---|---|
| WL M → | DA00 (4kB) | |
| WL N → | DA01 (4kB) | |
| WL O → | DA02 (4kB) | |
| WL P → | DA03 (4kB) | |

| PLANE 0 | PLANE 1 |
|---------|---------|
| 0 | 1 |
| 2 | 3 |
| 4 | 5 |
| 6 | 7 |
| 8 | 9 |
| A | B |
| C | D |
| E | F |
| 10 | 11 |
| 12 | 13 |
| ... | ... |
| 0 | 1 |
| 2 | 3 |
| 4 | 5 |
| 6 | 7 |
| 8 | 9 |
| A | B |
| C | D |
| E | F |
| ... | ... |
|  |  |
| 7FE | 7FF |

| PLANE 0 | PLANE 1 |
|---------|---------|
| 0 | 1 |
| 2 | 3 |
| 4 | 5 |
| 6 | 7 |
| 8 | 9 |
| A | B |
| C | D |
| E | F |
| ... | 11 |
| ... | 13 |
| 7FE | 7FF ... |
| 800 | 801 |
| 802 | 803 |
| 804 | 805 |
| 806 | 807 |
| 808 | 809 |
| 80A | 80B |
| 80C | 80D |
| 80E | 80F |
| ... | ... |
|  |  |

| PLANE 0 | PLANE 1 |
|---|---|
| 0 | 0 |
| 2 | 1 |
| 4 | 2 |
| 6 | 3 |
| 8 | 4 |
| A | 5 |
| C | 6 |
| E | 7 |
| 10 | 8 |
| 12 | 9 |
| ... | ... |
| 400 | 801 |
| 402 | 803 |
| 404 | 805 |
| 406 | 807 |
| 408 | 809 |
| 40A | 80B |
| 40C | 80D |
| 40E | 80F |
| ... | ... |
| 7FF | |

| PLANE 0 | PLANE 1 |
|---|---|
| 0 | 1 |
| 1 | 3 |
| 2 | 5 |
| 3 | 7 |
| 4 | 9 |
| 5 | B |
| 6 | D |
| 7 | F |
| 8 | 11 |
| 9 | 13 |
| ... | ... |
| 800 | 400 |
| 802 | 402 |
| 804 | 404 |
| 806 | 406 |
| 808 | 408 |
| 80A | 40A |
| 80C | 40C |
| 80E | 40E |
| ... | ... |
| | 7FF |

FIG. 8C

| A=1 | A=0 |
|-----|-----|
| B=0 | B=1 |
| C=0 | C=0 |
| D=0 | D=0 |

| PLANE 0 | PLANE 1 | | PLANE 0 | PLANE 1 |
|---------|---------|---|---------|---------|
| 0 | 1 | | 0 | 1 |
| 1 | 3 | | 2 | 3 |
| 2 | 5 | | 4 | 5 |
| 3 | 7 | | 6 | 7 |
| 4 | 9 | | 8 | 9 |
| 5 | B | | A | B |
| 6 | D | | C | D |
| 7 | F | | E | F |
| ... | 11 | | 10 | 11 |
| 3FE | 13 | | 12 | 13 |
| 3FF |  | | ... |  |
| 800 | 801 | | 0 | 801 |
| 802 | 803 | | 1 | 803 |
| 804 | 805 | | 2 | 805 |
| 806 | 807 | | 3 | 807 |
| 808 | 809 | | 4 | 809 |
| 80A | 80B | | 5 | 80B |
|  |  | | 6 |  |
|  |  | | 7 |  |
|  |  | | ... |  |
|  |  | | 3FE |  |
|  |  | | 3FF |  |

| PLANE 0 | PLANE 1 |
|---|---|
| 0 | 0 |
| 2 | 1 |
| 4 | 2 |
| 6 | 3 |
| 8 | 4 |
| A | 5 |
| C | 6 |
| E | 7 |
| 10 | ... |
| 12 | 3FE |
| ⋮ | 3FF |
| 800 | 801 |
| 802 | 803 |
| 804 | 805 |
| 806 | 807 |
| 808 | 809 |
| 80A | 80B |
| | |
| | |

A=0
B=0
C=0
D=1

| PLANE 0 | PLANE 1 |
|---|---|
| 0 | 1 |
| 2 | 3 |
| 4 | 5 |
| 6 | 7 |
| 8 | 9 |
| A | B |
| C | D |
| E | F |
| 10 | 11 |
| 12 | 13 |
| ⋮ | ... |
| 800 | 0 |
| 802 | 1 |
| 804 | 2 |
| 806 | 3 |
| 808 | 4 |
| 80A | 5 |
| | 6 |
| | 7 |
| | ... |
| | 3FE |
| | 3FF |

SYSTEMS AND METHODS FOR CAPACITY MANAGEMENT OF A MEMORY SYSTEM

TECHNICAL FIELD

This disclosure relates to memory systems and in particular, to systems and methods for capacity management of the memory systems.

BACKGROUND

Non-volatile memory systems are a type of memory that retains stored information without requiring an external power source. Non-volatile memory is widely used in various electronic devices and in stand-alone memory devices. For example, non-volatile memory can be found in laptops, digital audio player, digital cameras, smart phones, video games, scientific instruments, industrial robots, medical electronics, solid-state drives, USB drives, memory cards, and the like. Non-volatile memory can be electronically programmed/reprogrammed and erased.

Examples of non-volatile memory systems include flash memory, such as NAND flash or NOR flash. NAND flash memory structures typically arrange multiple memory cell transistors (e.g., floating-gate transistors or charge trap transistors) in series with and between two select gates (e.g., a drain-side select gate and a source-side select gate). The memory cell transistors in series and the select gates may be referred to as a NAND string. NAND flash memory may be scaled in order to reduce cost per bit.

SUMMARY

This disclosure relates generally to memory management systems and methods.

An aspect of the disclosed embodiments includes a memory management method. The method includes identifying memory segments of a memory device. The method also includes identifying, for each memory segment, a number of faulty columns. The method also includes determining a total number of faulty columns for the memory device based on the number of faulty columns for each respective memory segment. The method also includes determining whether the total number of faulty columns is greater than a threshold. The method also includes, in response to a determination that the total number of faulty columns is greater than the threshold, identifying a first memory segment of the memory segments having a highest number of faulty columns. The method also includes disabling the first memory segment.

Another aspect of the disclosed embodiments includes a controller. The controller includes a bus interface in communication with one or more memory blocks of a memory system and a processor. The processor is configured to: identify memory segments of a memory block of the one or more memory blocks; identify, for each memory segment, a number of faulty columns; determine a total number of faulty columns for the memory block based on the number of faulty columns for each respective memory segment; determine whether the total number of faulty columns is greater than a threshold; in response to a determination that the total number of faulty columns is greater than the threshold, identify a first memory segment of the memory segments having a highest number of faulty columns; and disable the first memory segment.

Another aspect of the disclosed embodiments includes a memory management system. The memory management system includes a memory die and a controller means. The memory die includes a plurality of planes. The controller means in communication with the at least one memory die, the controller means configured for: identifying memory segments of each plane of the plurality of planes; identifying, for each memory segment, a number of faulty memory blocks; determining a total number of faulty memory blocks for the memory die based on the number of faulty memory blocks for each respective memory segment; determining whether the total number of faulty memory blocks is greater than a threshold; in response to a determination that the total number of faulty memory blocks is greater than the threshold, identifying a first memory segment of the memory segments having a highest number of faulty memory blocks; and disabling the first memory segment.

These and other aspects of the present disclosure are disclosed in the following detailed description of the embodiments, the appended claims, and the accompanying figures.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

FIGS. 1A-1B generally illustrate a block diagram of an example non-volatile memory system according to the principles of the present disclosure.

FIG. 6 generally illustrates a POR dataset distribution according to the principles of the present disclosure.

Figure 8A:
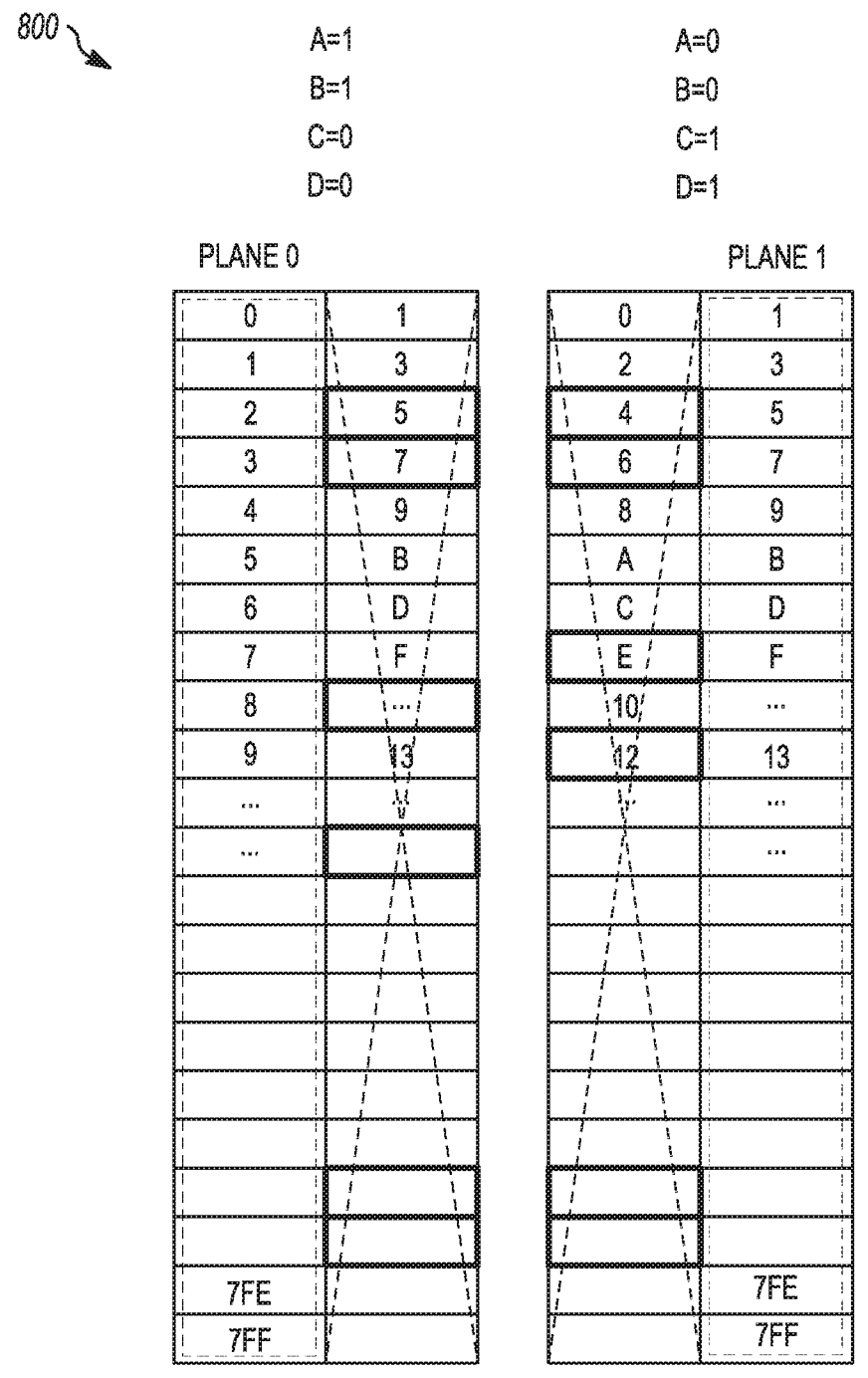

FIGS. 8A-8E generally illustrate memory plane capacity distribution according to the principles of the present disclosure.

DETAILED DESCRIPTION

Figure 1B:
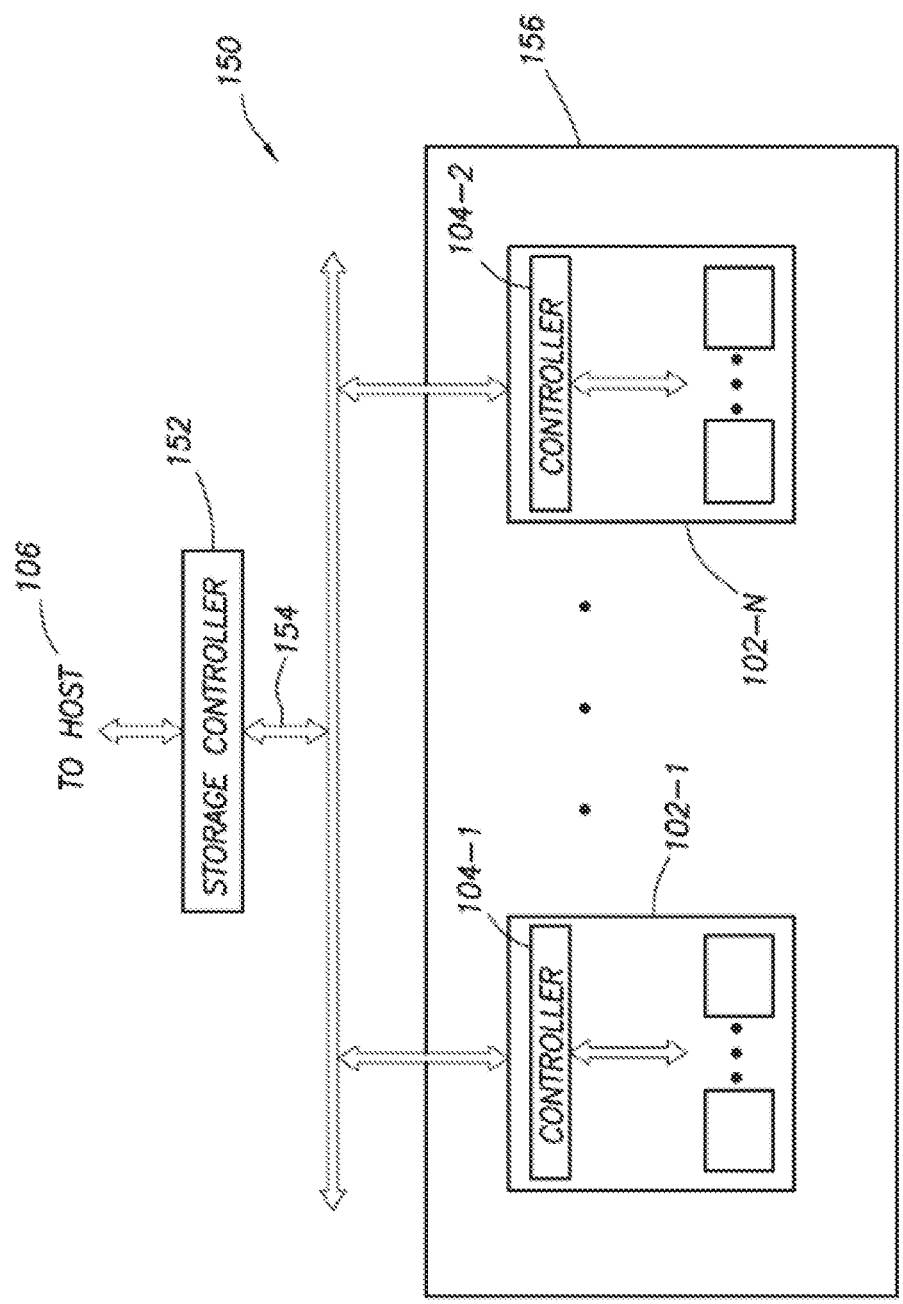

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

As described, non-volatile memory systems are a type of memory that retains stored information without requiring an external power source. Non-volatile memory is widely used in various electronic devices and in stand-alone memory devices. For example, non-volatile memory can be found in laptops, digital audio player, digital cameras, smart phones, video games, scientific instruments, industrial robots, medical electronics, solid-state drives, USB drives, memory cards, and the like. Non-volatile memory can be electronically programmed/reprogrammed and erased.

Examples of non-volatile memory systems include flash memory, such as NAND flash or NOR flash. NAND flash memory structures typically arrange multiple memory cell transistors (e.g., floating-gate transistors or charge trap transistors) in series with and between two select gates (e.g., a drain-side select gate and a source-side select gate). The memory cell transistors in series and the select gates may be referred to as a NAND string. NAND flash memory may be scaled in order to reduce cost per bit.

In such a memory system, memory dies may include multiple memory planes comprising memory blocks. The memory blocks include memory cells that may be organized by rows (e.g., word lines) and columns (e.g., a column refers to 8 bit lines). Ideally, to use 100% memory capacity of the memory die, all columns in the memory die should be capable of storing data programmed to the memory die. Due to manufacturing defects, some bit lines may be shorted or open and may lose bit-storing capability, which may result in faulty columns. Leakage tests during a memory die sorting phase may be used to detect faulty columns in the memory die. If any one bit line, or more, in a column are detected as faulty, the corresponding column is marked as faulty and will not be used for read operations and write operations. Typically, a column redundancy circuit (CRD) is included in a corresponding memory die, which internally replaces faulty columns with good columns, without operator intervention for user read and/or write operations.

Based on the memory die area estimates with respect to the CRD, a number of allowed or acceptable faulty columns per the memory die are fixed, which typically equals the number of CRD registers (e.g., which store faulty columns after reading from previously programmed ROMfuse block during power up of memory die). Typically, an isolation latch circuit is used to isolate faulty columns from bit scan operation of program verify operation. Isolation latches of all faulty columns are set during power up operation along with storing faulty column info in CRD.

During operation of the memory system, a controller may perform various memory tests, such as a built-in self-test, to identify faulty memory components, such as faulty memory blocks, faulty columns, and so on. The controller may determine a total number of faulty memory components for a memory plane. The controller may then determine whether the total number of faulty memory components for the memory plane exceeds an acceptable number of faulty memory components.

If the controller determines that the total number of faulty memory components does not exceed the acceptable number of faulty memory components, the controller may load addresses of identified faulty columns as information into memory word lines of a dedicated memory block (e.g., referred to as a ROM Fuse block or ROMFuse) through programming and becomes a read-only memory (ROM) block. The ROMfuse block information is read each time the memory system powers on. The memory NAND controller reads information of faulty column addresses and accordingly logically map spare columns to operate in place of the faulty columns during performance of Flash write and read operations. Conversely, if the controller determined that the total number of faulty memory components exceeds the acceptable number of faulty memory components, the controller disable the memory plane. However, in many cases, the faulty memory components may be spread across the entire memory plane (e.g., not concentrated in one portion of the memory plane) with certain portions of the memory plane having relatively large concentrations of faulty memory components. Typically, relatively large portions of the memory plane do not include faulty memory components, and may continue to be functional as storage for the memory system.

Accordingly, systems and methods, such as those described herein, that are configured to identify faulty memory components for memory segments of a memory device (e.g., a memory die, memory plane, or the like) and to disable memory segments having higher concentrations of faulty memory components, while allowing other memory segments of the memory device to continue to provide storage capacity for a memory system, may be desirable.

In some embodiments, the systems and methods described herein may be configured to improve a yield of a memory device using column address jump management, such that a memory die (e.g., or a memory chip) may continue to provide 75%, 50%, or 25% storage capacity based on faulty columns profile being spread across an entire page (e.g., instead of discarding the memory die completely when the detected total number of faulty memory columns exceed the acceptable number of faulty memory columns). In some embodiments, the systems and methods described herein may be configured to utilize otherwise dead or discarded memory dies (e.g., this may be referred to as the memory dies being re-born) with reduced and/or different memory die capacities based on the faulty column provide, resulting in, for example, 8-die packages having 0.75 terabyte, 0.5 terabyte, or 256 gigabyte capacity.

In some embodiments, the systems and methods described herein may be configured to implement an improved built-in self-test process flow. The systems and methods described herein may be configured to increase ROMfuse data copies for a relatively higher probability of a successful power on read (POR) operation. The systems and methods described herein may be configured to isolate a latch marching a new sequence. The systems and methods described herein may be configured to implement column address jump during performance of read operations and write operations.

In some embodiments, the systems and methods described herein may be configured to identify faulty columns of a memory die. For example, the memory die may include 16 thousand physical columns. The systems and methods described herein may be configured to divide the memory die into bundles (e.g., memory segments) each including 4 thousand physical columns. The systems and methods described herein may be configured to, during performance of a memory die-sorting process, perform a faulty column detection sequence. The systems and methods described herein may be configured to identify a total number of faulty columns for each memory segment.

The systems and methods described herein may be configured to calculate or determine a cumulative number of faulty columns for the memory die (e.g., by summing the number of faulty columns determined for each of the memory segments). The systems and methods described herein may be configured to determine whether the total number of faulty columns is less than a threshold (e.g., a number of allowable or acceptable faulty columns). The systems and methods described herein may be configured to, in response to a determination that the total number of faulty columns is less than the threshold, load all identified faulty columns into the ROMfuse block using a programming operation (e.g., the memory capacity for the memory die is 100%).

The systems and methods described herein may be configured to, in response to a determination that the total number of faulty columns is greater the threshold, identify and filter out a memory segment of the memory segments having the highest number of faulty columns (e.g., define the memory segment having the highest number of faulty columns as a bad memory segment or bundle). For example, the memory segments may be referred to as memory segment 1, memory segment 2, memory segment 3, and memory segment 4. The possible combinations of memory segments left after identifying the memory segment with the highest number of faulty columns include: $\{1, 2, 3\}$, $\{1, 2, 4\}$, $\{1, 3, 4\}$, and $\{2, 3, 4\}$.

The systems and methods described herein may be configured to determine an updated total number of faulty columns for the memory die (e.g., based on the three memory segments remaining). The systems and methods described herein may be configured to determine whether the updated total number of faulty columns is less than the threshold. The systems and methods described herein may be configured to, in response to a determination that the updated total number of faulty columns is less than the threshold, load all identified faulty columns into the ROMfuse block using a programming operation (e.g., the memory capacity for the memory die is 75%).

The systems and methods described herein may be configured to, in response to a determination that the updated total number of faulty columns is greater the threshold, identify and filter out a memory segment of the memory segments having the highest number of faulty columns (e.g., define the memory segment having the highest number of faulty columns as a bad memory segment or bundle). The possible combinations of memory segments left after identifying the memory segment with the highest number of faulty columns include: $\{1, 2\}$, $\{1, 3\}$, $\{1, 4\}$, $\{2, 3\}$, $\{2, 4\}$, and $\{3, 4\}$.

The systems and methods described herein may be configured to determine an updated total number of faulty columns for the memory die (e.g., based on the two memory segments remaining). The systems and methods described herein may be configured to determine whether the updated total number of faulty columns is less than the threshold. The systems and methods described herein may be configured to, in response to a determination that the updated total number of faulty columns is less than the threshold, load all identified faulty columns into the ROMfuse block using a programming operation (e.g., the memory capacity for the memory die is 50%).

The systems and methods described herein may be configured to, in response to a determination that the updated total number of faulty columns is greater the threshold, identify and filter out a memory segment of the memory segments having the highest number of faulty columns (e.g., define the memory segment having the highest number of faulty columns as a bad memory segment or bundle). The possible combinations of memory segments left after identifying the memory segment with the highest number of faulty columns include: $\{1\}$, $\{2\}$, $\{3\}$, and $\{4\}$.

The systems and methods described herein may be configured to determine an updated total number of faulty columns for the memory die (e.g., based on the one memory segment remaining). The systems and methods described herein may be configured to determine whether the updated total number of faulty columns is less than the threshold. The systems and methods described herein may be configured to, in response to a determination that the updated total number of faulty columns is less than the threshold, load all identified faulty columns into the ROMfuse block using a programming operation (e.g., the memory capacity for the memory die is 25%).

The systems and methods described herein may be configured to, in response to a determination that the updated total number of faulty columns is greater the threshold, determine none of the memory segments are within the acceptable number of faulty columns and the memory die is determined to be defective (e.g., 0% of the memory die is usable).

In some embodiments, the systems and methods described herein may be configured to, in case of 75% or 50% or 25% memory capacities of the memory die, allow configurability using a ROMfuse read operation, isolation latch marking, and the column address jump operations using a 4-bit parameter to identify memory segments not marked as faulty (e.g., the memory segments used to determine the memory capacity of the memory die). For example, bit '1' may refer to a "good" memory segment and bit '0' may refer to a "bad" (e.g., discarded) memory segment.

In some embodiments, the systems and methods described herein may be configured to identify faulty memory blocks of a memory die. The faulty memory blocks may be randomly distributed or distributed in clusters in an array geography (e.g., top area of a memory plane, bottom area of a memory plane, center area of a memory plane, in a left plane, or a right plane, etc.)

The systems and methods described herein may be configured to, during performance of a memory test at a production factory (e.g., during manufacturing of the memory die), determine whether a total of faulty memory blocks for a memory die exceeds an acceptable number of faulty memory blocks. The systems and methods described herein may be configured to, in response to the number of faulty memory blocks exceeding the acceptable number of faulty memory blocks, selectively adjust the memory capacity of the memory die. For example, the memory capacity of a 32 gigabyte memory die may be adjusted to 16 gigabyte, 8 gigabyte, and so on.

In some embodiments, the systems and methods described herein may be configured to identify memory segments of a memory device. The systems and methods described herein may be configured to identify, for each memory segment, a number of faulty columns. The systems and methods described herein may be configured to determine a total number of faulty columns for the memory device based on the number of faulty columns for each respective memory segment. The systems and methods described herein may be configured to determine whether the total number of faulty columns is greater than a threshold. The systems and methods described herein may be configured to, in response to a determination that the total number of faulty columns is greater than the threshold, identify a first memory segment of the memory segments having a highest number of faulty columns. The systems and methods described herein may be configured to disable the first memory segment.

In some embodiments, the systems and methods described herein may be configured to provide yield improvement for various memory dies (e.g., a discarded memory die may be re-used with a different memory capacity). In some embodiments, the systems and methods described herein may be configured to provide improved program operations and read operations performance times (e.g., bit scan operation may be relatively faster for a memory die having a reduced memory capacity). In some embodiments, the systems and methods described herein may be configured to provide minimal impact on firmware. For example, the memory segments (e.g., bundles of 4 thousand physical columns) are compatible with existing with firmware.

In some embodiments, the systems and methods described herein may be configured to provide minimal impact on the memory die circuit area. In some embodiments, the systems and methods described herein may be configured to reduce operating and manufacturing costs by: reusing memory dies that would otherwise be discarded; by converting the memory capacity of an inked memory die, that would otherwise be discarded; by converting a majority of an inked memory die to a half capacity prime memory die; and by generating multi-die packages using memory dies with adjusted capacities, that would otherwise be discarded.

FIG. 1A illustrates a block diagram of an example system architecture 100 including non-volatile memory. In particular, the example system architecture 100 includes storage system 102 (e.g., which may be referred to as a memory system), a controller 104, and a host 106. In various embodiments, the host 106 can include any device or system that utilizes the storage system 102. In some embodiments, various aspects of the controller 104 may be implemented by the host 106 or the host 106 can include its own controller (e.g., a processor) configured to execute instructions stored in the storage system 102 and further the host 106 can access data stored in the storage system 102.

Examples of the host 106 include computing devices such as a desktop computer, rack mounted server, a laptop, a smartphone, a tablet, or other suitable computing devices. Host 106 can also include systems and devices such as a gaming system, a digital phone, a digital camera (e.g., digital still cameras and digital movie cameras), portable media player, digital photo frame, remote control, television stick, smart television, and the like. Furthermore, the system architecture 100 can be implemented in a memory card such as secure digital (SD) card or a micro secure digital (micro-SD) card. In some embodiments, the system architecture 100 is embedded in the host, for example as a solid-state disk (SSD) drive installed in a laptop computer.

In embodiments where the system architecture 100 is implemented within a memory card, the host 106 can include a built-in receptacle for one or more types of memory cards or flash drives (e.g., a universal serial bus (USB) port, or a memory card slot). Additionally, or alternatively, the host 106 can include adapters into which a memory card may be plugged. The foregoing examples of a host are not meant to be limiting examples. On the contrary, a host 106 can include any type of device, system, and apparatus that accesses the storage system 102.

In FIG. 1A, the storage system 102 includes a memory controller and drivers (e.g., controller 104)—as will be described further below—however, in some embodiments of the storage system 102, the storage system 102 may include memory-only units that are instead controlled by software executed by a controller on the host 106 (e.g., a processor of a computing device controls, including error handling of, the storage system 102). Furthermore, although FIG. 1A illustrates the storage system 102 as separate from the host 106, in some embodiments, the storage system 102 is embedded with the host 106, where the memory, controller, and drivers are formed on a single integrated circuit chip.

The host 106 can communicate with the storage system 102 using of a bus 112 that implements any known or after developed communication protocol that enables the storage system 102 and the host 106 to communicate. The communication protocol may include Secure Digital (SD) protocol, Memory stick (MS) protocol, USB protocol, Advanced Microcontroller Bus Architecture (AMBA), or other suitable communication protocol.

In various embodiments, the controller 104 acts as an interface between the host 106 and the storage system 102. The host 106 may communicate with the controller 104 via a bus interface associated with the bus 112. The controller 104 can include individual circuit components, processing circuitry (e.g., logic gates and switches), a processor, a microprocessor, a microcontroller with controlling software, or a field programmable gate array (FPGA). Furthermore, the example controller 104 includes a computer-readable medium that stores computer-readable program code (e.g., software or firmware) executable by the processor. In some embodiments, the controller 104 is a flash memory controller. In some embodiments, the controller 104 is a processor executing within the host 106.

Still referring to FIG. 1A, according to some embodiments, the controller 104 acts as an interface between the host 106 and the storage system 102 and manages data stored on the storage system 102. For example, the controller 104 may receive commands or instructions from the host 106 and may perform read operations, write operations, programming operations, erase operations, other suitable operations, or a combination thereof on the memory of the storage system 102 in response to the commands or instructions communicated by the host 106. The host 106 can access data stored in the storage system 102 by providing a logical address, via the bus interface associated with the bus 112, to the controller 104, which, the controller 104 converts to a physical address. The controller 104 can access data and/or a particular storage location associated with the physical address and facilitate transferring data between the storage system 102 and the host 106. In some embodiments, where the storage system 102 includes flash memory, the controller 104 formats the flash memory to ensure the memory is operating properly, maps out bad flash memory cells, and allocates spare cells to be substituted for future failed cells or used to hold firmware to operate the flash memory controller (e.g., the controller 104).

Accordingly, the controller 104 performs various memory management functions such as wear leveling (e.g., distributing writes to extend the lifetime of the memory blocks), garbage collection (e.g., moving valid pages of data to a new block and erasing the previously used block), and error detection and correction (e.g., read error handling).

Still referring to FIG. 1A, the storage system 102 includes the non-volatile memory (NVM) block 110 which may include several memory die 110-1-110-N. In some embodiments, the NVM block 110 defines a physical set of memory die, such as the memory die 110-1-110-N. In other embodiments, the NVM block 110 defines a logical set of memory die, where the NVM block 110 includes memory die from several physically different sets of memory die. The manner in which the NVM block 110 is defined in FIG. 1A is not meant to be limiting.

Each memory die, for example memory die 110-1, includes non-volatile memory cells, such as NAND flash memory cells, NOR flash memory cells, or other suitable memory cells. As the memory cells are non-volatile, the memory cells in the storage system 102 retain data even when there is an interruption in power supplied to the memory cells and/or the storage system 102. Thus, the storage system 102 can be easily transported and the storage system 102 can be used in memory cards and other memory devices that are not always connected to a power supply.

In various embodiments, the memory cells in the memory die 110 are solid-state memory cells (e.g., flash) and are one-time programmable, few-time programmable, or many time programmable. Additionally, the memory cells in the memory die 110 can include single-level cells (SLC or 1-bit/cell), multiple-level cells (MLC or 2-bits/cell), triple-level cells (TLC or 3-bits/cell), or quad-level cells (QLC or 4-bits/cell). In some embodiments, the memory cells are fabricated in a planar manner (e.g., 2D NAND (NOT-AND) flash) or in a stacked or layered manner (e.g., 3D NAND flash). That is, planar flash memory includes a single layer of memory cell, while stacked flash memory includes memory cells that are stacked vertically in multiple layers (e.g., referred to as planes).

In some embodiments, and as shown in FIG. 1A, the controller 104 and the NVM block 110 are communicatively coupled by an interface 114 that implements any known or after developed communication protocol. In embodiments where the storage system 102 is flash memory, the interface 114 is a flash interface, such as Toggle Mode 200, 400, 800, or Common Flash Memory Interface (CFI). In various embodiments, the interface 114 can be implemented by several channels (i.e., physical connections) disposed between the controller 104 and the individual memory die 110-1-110-N. Furthermore, the number of channels over which the interface 114 is established varies based on the capabilities of the controller 104. Additionally, a single channel can be configured to communicatively couple more than one memory die. The depiction of a single interface 114 is not meant to be limiting. To the contrary, the single interface is representative of an example interface that can be used between components, and one or more interfaces can be used to communicatively couple the same components.

FIG. 1B generally illustrates a block diagram of the system architecture 100 according to the principles of the present disclosure. The system architecture 100 can be implemented as part of a larger system architecture. For example, as shown in FIG. 1B, the system architecture 150 includes a storage module 156 that further includes several storage systems 102. Within the example system architecture 150, the storage module 156 is communicatively coupled with the host 106 by way of a storage controller 152. In particular, an interface 154 between the host 106 and the storage module 156 includes a bus interface that implements any known or after developed communication protocol, such as a serial advanced technology attachment (SATA) or peripheral component interface express (PCIe) interface. In some embodiments, the storage module 156 is an SSD (e.g., in a laptop computer or a tablet).

Some implementations of the system architecture 100 include a hierarchical storage system. A hierarchical storage system can include a plurality of storage controllers 152, each of which control a respective storage system 102. Furthermore, a plurality of hosts 106 can each access the hierarchical storage system. Hosts 106 can access memories within the hierarchical storage system via a bus interface that implements any known or after developed communication protocol including a non-volatile memory express (NVMe) or a fiber channel over Ethernet (FCoE) interface. The hierarchical storage system can be implemented as a rack mounted storage system that is accessible by multiple host computers (e.g., a data center).

The interface 154 can be implemented by several channels (i.e., physical connections) disposed between the storage controller 152 and the storage module 156. In some embodiments, the number of channels over which an interface 154 is established varies based on the capabilities of the storage controller 152. The depiction of a single interface is not meant to be limiting and the single interface is representative of an example interface that can be used between components, where one or more interfaces can be used to communicatively couple various components.

Figure 2A:
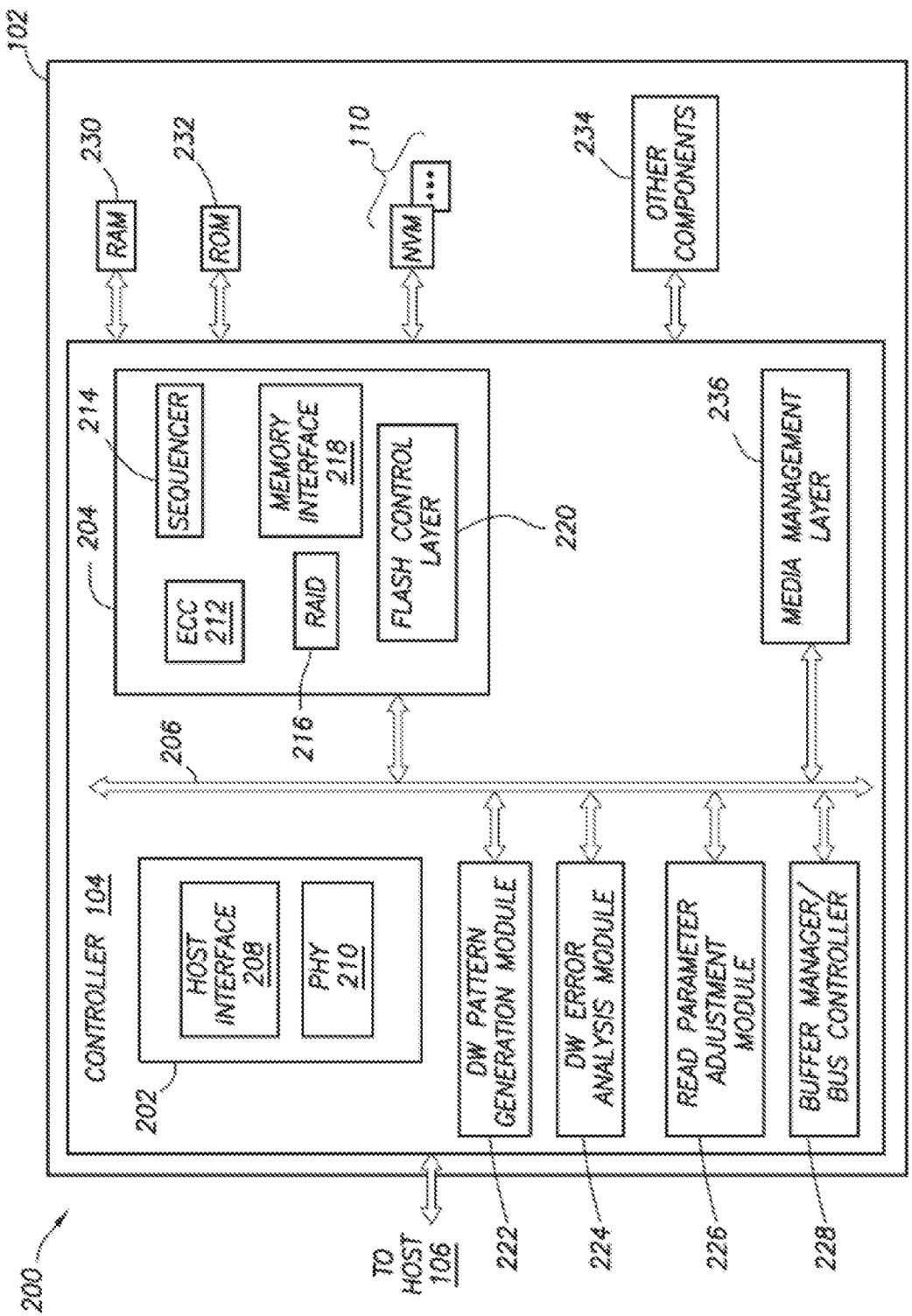
FIG. 2A generally illustrates a block diagram of example components of a controller according to the principles of the present disclosure.

FIG. 2A generally illustrates a block diagram 200 of the storage system 102, according to the principles of the present disclosure. The block diagram 200 of the storage system 102 includes components previously described in FIG. 1A, such as the controller 104 and the NVM memory block 110. Additional components that can be present within the storage system 102 include a random access memory (RAM) 230, a read only memory (ROM) 232, and other components 234. In some embodiments, the ROM 232 stores system boot code.

Although the RAM 230 and the ROM 232 are shown as separate modules within the storage system 102, the illustrated architecture is not meant to be limiting. For example, the RAM 230 and the ROM 232 can be located within the controller 104. In some embodiments, portions of the RAM 230 or ROM 232, respectively, are located outside the controller 104 and within the controller 104. In other embodiments, the controller 104, the RAM 230, and the ROM 232 can be located on separate semiconductor die. In various embodiments, the other components 234 include external electrical interfaces, external RAM, resistors, capacitors, logic gates, or other components that interface with the controller 104.

In some embodiments, the controller 104 includes a module 202 that interfaces with the host 106, a module 204 that interfaces with the NVM memory block 110, as well as various other modules, described further below. The modules within the controller (e.g., modules 202 and 204) are communicatively coupled to each other by a bus 206.

The following discussion of the various modules depicted within the controller 104 are meant to be illustrative and not limiting. For example, the various modules generally illustrated in FIG. 2A are not limited to being executed within the controller 104, and in some embodiments, one or more modules can be executed outside the controller 104.

The module 202 interfaces with the host 106 and includes a host interface 208 and a physical layer interface 210 that provides the electrical interface between the host 106 or next level storage controller and the controller 104. The host interface 208 facilitates transferring of data, control signals, and timing signals. Examples of the host interface 208 include SATA, SATA express, Serial Attached SCSI (SAS), Fibre Channel, USB, PCIe, and NVMe.

Still referring to FIG. 2A, in various embodiments, the module 204 is configured to communicate with the NVM block 110 and includes an error correcting code (ECC) engine 212. In some embodiments, the ECC engine 212 encodes data received from the host 106 and stores the encoded data in the NVM block 110. When the data is read out from the NVM memory block 110, the ECC engine 212 decodes the data and corrects errors detected within the data To detect errors, the ECC engine 212 implements various types of error checking using algorithms such as low-density parity-check (LDPC) code, Bose-Chaudhuri-Hocquenghem (BCH) code, a soft read, and/or extra parity.

The example module 204 also includes a sequencer 214 and a Redundant Array of Independent Drives (RAID) module 216. In various embodiments, the sequencer 214 generates command sequences, such as program and erase command sequences that are transmitted to the NVM memory block 110. The RAID module 216 generates RAID parity and recovery of failed data. The RAID parity can be used to provide an additional level of integrity protection for data written into the NVM memory block 110. In some embodiments, the ECC engine 212 implements the functions of the RAID module 216.

The example module 204 also includes a memory interface 218 that provides the command sequences to the NVM memory block 110 and receives status information from the NVM memory block 110. For example, the memory interface 218 implements any known or after developed communication protocol including a double data rate (DDR) interface, such as a Toggle Mode 200, 400, or 800 interface. The module 204 also includes a flash control layer 220 that controls the overall operation of the module 204.

Still referring to example modules within the controller 104 in FIG. 2A, additional modules within the controller 104 includes a dummy word line (DW) pattern generation module 222, a DW error analysis module 224, and a read parameter adjustment module 226. Dummy word lines are placed on non-volatile memory die that are used for the purposes of analyzing and tracking behavior and health of a respective non-volatile memory die. In various embodiments, the DW pattern generation module 222 puts a known data pattern into a dummy word line and tracks or periodically check for errors by reading the data back out of the dummy word line and comparing the data to the known data pattern.

In various embodiments, the read parameter adjustment module 226 adjusts parameters associated with a particular non-volatile memory die. For example—and as discussed further below—the read parameters adjustment module 226 can adjust parameters associated with a particular non-volatile memory die during an operation—i.e., a read or write—to adjust or re-adjust the read parameters. During the operation to re-adjust the read parameters, the read parameter adjustment module 226 adjusts the read parameters for a particular memory block, reads data out of the memory block, and verifies a resulting BER. If the resulting BER falls at or below a target or expected BER, the read parameters adjustment module 226 stores the read parameters for the memory block. Subsequently, the stored read parameters are used during a read of any word line within the memory block. Thus, read parameters can be unique to a memory block.

Additional modules within the example controller 104 include a buffer manager/bus controller 228 that manages, for example, buffers in the RAM 230 and controls the internal bus arbitration of the bus 206 in the controller 104. Additionally, or alternatively, the controller 104 can include a media management layer 236 that performs wear leveling of the NVM memory block 110. As previously mentioned, the various modules described with respect to the controller 104 are not meant to be limiting as to the architecture of the controller 104. For example, the physical layer interface 210, the RAID module 216, the media management layer 236, and the buffer management/bus controller 228 can be examples of optional components within the controller 104.

Furthermore, in embodiments where the storage system 102 includes flash memory, the media management layer 236 can be integrated as part of the flash management that handles flash error and interfaces with the host 106. In particular, the media management layer 236 can include an algorithm (e.g., firmware in the memory device), that translates a write command received from the host 106 into a write to the NVM memory block 110.

Figure 2B:
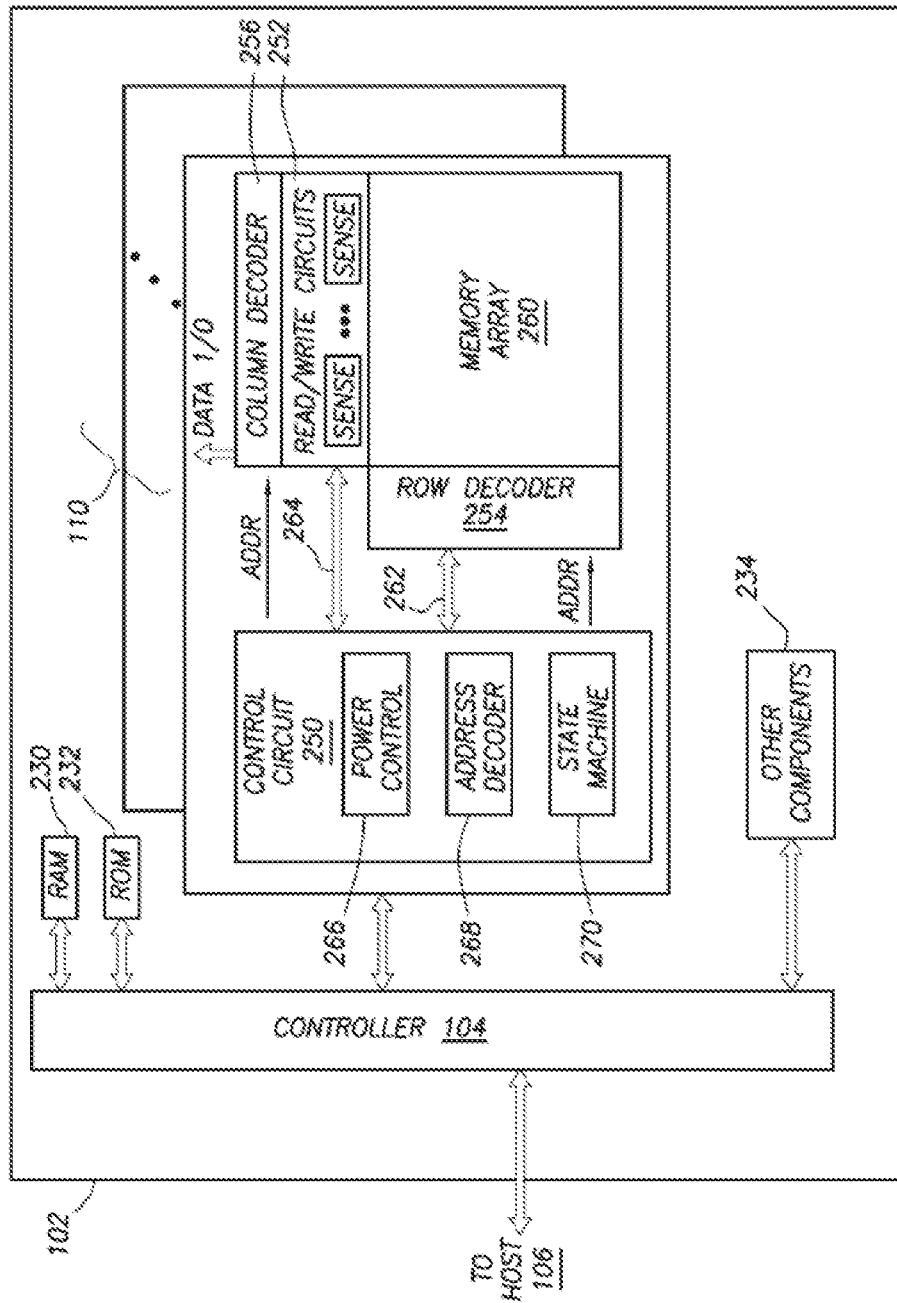
FIG. 2B generally illustrates a block diagram of example components of a non-volatile memory storage system according to the principles of the present disclosure.

FIG. 2B generally illustrates a block diagram with various features of the NVM memory block 110 within the storage system 102. As details of the controller 104 have been previously described (in FIG. 2A), in FIG. 2B the controller 104 is illustrated as a single block. Additionally, previously described RAM 230, the ROM 232, and the other components 234 are included in FIG. 2B to help orient the reader. Next, details within an example memory die 110-1 are discussed. Although the discussion centers on the memory die 110-1, each of the features discussed in relation to the memory die 110-1 equally applies to all of the memory dies within NVM memory block 110.

In some embodiments, the example memory die 110-1 includes control circuit 250, read/write circuits 252, a row decoder 254, a column decoder 256, and a memory array 260. The memory array 260 can include a two-dimensional array or a three-dimensional array of memory cells. The read/write circuits 252 read and program pages of memory within the memory die 110-1, in parallel. In various embodiments, the memory array 260 is accessed by word lines via the row decoder 254 and by bit lines via the column decoder 256.

The architecture of the memory die 110-1 is not meant to be limiting and any known architecture that can perform the functions of accessing the memory array 260 can be used without departing from the scope of this disclosure. For example, in various embodiments, access to the memory array 260 by various peripheral circuits can be implemented in a symmetric fashion on opposite sides of the memory array 260, which reduces the densities of access lines, and circuitry on each side of the memory array 260.

Still referring to FIG. 2B, in various embodiments, the example control circuit 250 includes a power control circuit 266, an address decoder 268, and a state machine 270. In some embodiments, the power control circuit 266, the address decoder 268, and the state machine 270 can be collectively referred to as managing circuits. The control circuit 250 and its various managing circuits are communicatively coupled by various interfaces (e.g., interfaces 262 and 264) to the row decoder 254 and the column decoder 256. In various embodiments, the control circuit 250 performs various operations on the memory array 260 that include reading or writing to the memory cells.

The power control circuit 266 controls the power and voltage supplied to the word lines and bit lines during operation of the memory array 260. The address decoder 268 provides an address interface that translates addresses between addresses provided by the host 106 and addresses used by the row decoder 254 and the column decoder 256. The example address decoder 268 converts an address provided by the host 106 to an address that is understood and compatible with a format used by the row decoder 254 and the column decoder 256. The state machine 270 provides chip-level control of memory operations.

Thus, the storage system 102 includes various components including the controller 104 and the NVM memory block 110, details of which have been described above in FIGS. 1A, 1B, 2A, and 2B. The discussion now turns to an example architecture of an example memory array 260 and in particular methods that can be performed to improve a performance of a read in the storage system 102.

Figure 3:
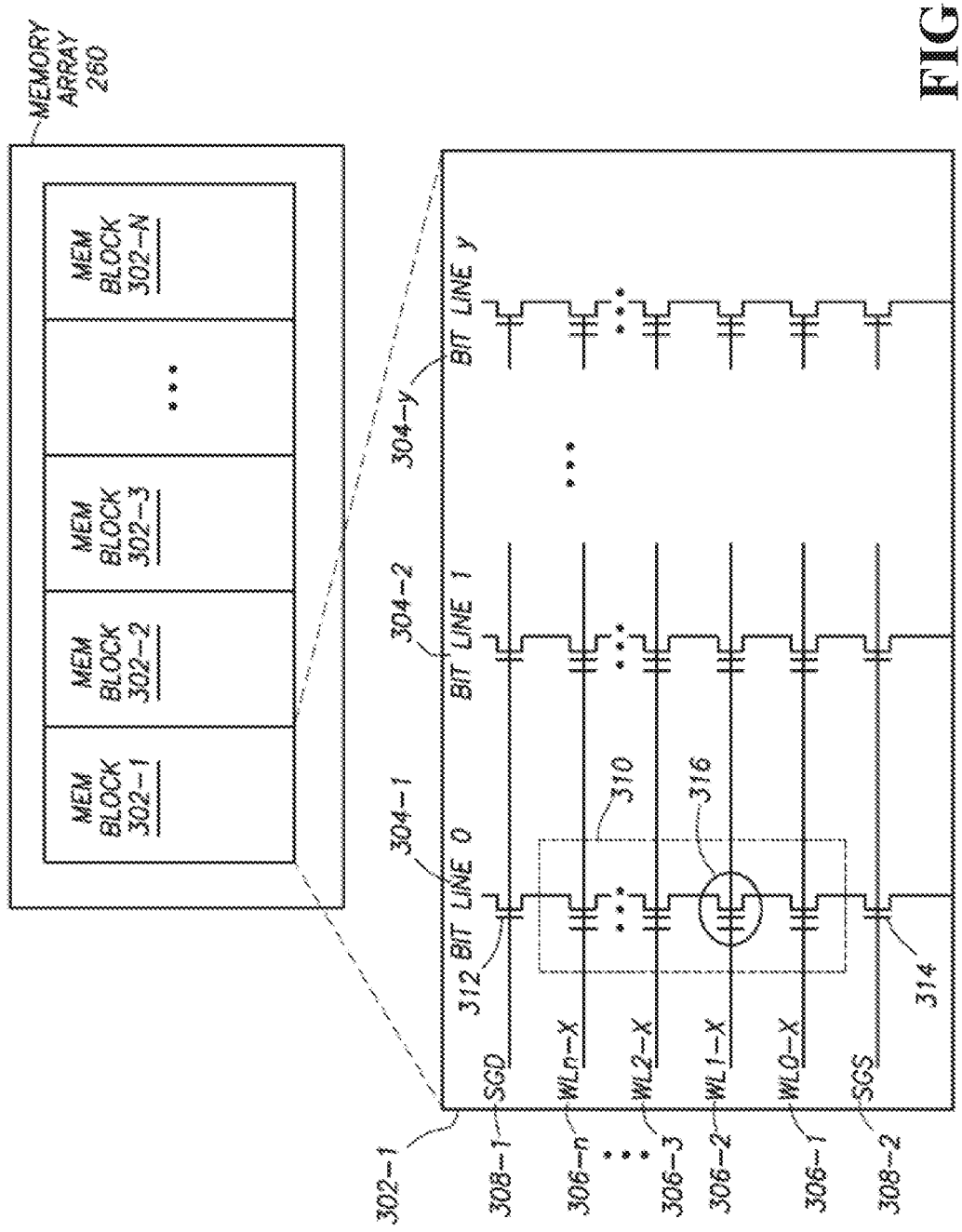
FIG. 3 generally illustrates a memory block according to the principles of the present disclosure.

FIG. 3 further illustrates the memory array 260. The memory array 260 is divided into several memory blocks 302. In flash memory, a memory block is defined as a unit of erase. That is, each memory block 302 includes a number of memory cells that are erased together or as a block. In some embodiments, the memory array 260 can be partitioned into any number of blocks, for example, the memory array 260 includes 1,024 blocks. Additionally, or alternatively, each of the memory blocks 302 can conceptually be divided into a number of pages defined as a unit of programming. In some embodiments, a page of data can be stored in one row of memory cells. Each page can include user data and overhead data, where the overhead data includes CC that has been calculated from the user data. In some embodiments, the memory blocks 302-1 to 302-N may include solid-state NAND memory blocks.

Each memory block 302, for example memory block 302-1, includes multiple bit lines 304, word lines 306, and select lines 308. Each bit line, for example bit line 304-1, is connected to several memory cells connected in series. More particularly, in an embodiment where each memory cell is a floating gate transistor, the floating gate transistors are connected in series to form a NAND string 310 (e.g., illustrated within the dashed box). Although four memory cells are shown in FIG. 3, the number of memory cells within the NAND string is not meant to be limiting. For example, 16, 32, 64, 128, or any other number of memory cells can be connected in a NAND string. Each respective bit line 304 is coupled to a respective NAND string within the block 302.

Still referring to FIG. 3, a method of reading data stored in a particular memory cell—e.g., memory cell 316—includes applying a voltage to the select lines 308 of the block 302, which in turn are coupled to respective NAND strings within the block 302, including the NAND string 310 the includes the memory cell 316. The voltage applied to the select lines 308 is greater than threshold voltages of the select transistors 312 and 314. The select transistor 312 is controlled by the select gate drain line (SGD) 308-1 and the select transistor 314 is controlled by the select gate source line (SGS) 308-2. Additionally, in order to read data in the memory cell 316, all other memory cells or unselected memory cells in the NAND string 319 are turned on (e.g., conducting current regardless of whether they are programmed or erased). The unselected memory cells have a read pass voltage—i.e., read parameters—applied to their respective word lines that turn on the unselected memory cells.

During the example read operation, various read compare levels—i.e., voltages—are applied to the word line 306-2 to determine the value stored in the memory cell 316. In some embodiments, the conduction current of the memory cell 316 is measured to determine the value stored within the memory cell 316. The method in which each memory cell is accessed and the number of memory cells accessed during a read or write varies. For example, all of the bit lines of the memory block 302-1 can be simultaneously programmed or read. In various embodiments, memory cells along a shared word line can be programmed at the same time (i.e., concurrently). In other embodiments, the bit lines can be divided into even bit lines and odd bit lines. In an odd/even bit line architecture, memory cells along a shared word line and connected to the odd bit lines are programmed at one time, while memory cells along a shared word line and connected to an even bit line are programmed at a different time.

Each time data is written to a memory block the data is processed by the ECC engine 212 which includes encoding the data (e.g., using a particular error correction code) and storing the encoded data in the memory block. When the data is read back out of the memory block, the data is processed by the ECC engine 212 which includes decoding the data, correcting errors (e.g., tracked as the BER), and returning the data to a user (by way of the controller 104). In some embodiments, the amount of time the ECC engine 212 takes to return data to the controller 104 is defined as the throughput time.

In some embodiments, the controller 104 performs data consolidation operations on the memory array 260. The controller 104 selects a source block from the memory block 302-1 to memory block 302-N of the memory array 260, for consolidation or compaction. For example, the controller 104 may select memory block 302-1 as the source block for consolidation or compaction. The memory block 302-1 may be referred to as the source block 302-1 throughout the example embodiments described herein. The source block 302-1 may include a plurality of memory fragments, such as 16 memory fragments or any suitable number of memory fragments. The memory fragments may include data written by the host 106 during a host write operation. The memory fragments may belong to respective logical groups and may be scattered or disorganized in the source block 302-1, such that memory fragments associated with the same logical group may not be sequentially stored or organized in the source block 302-1. Additionally, or alternatively, while some memory fragments include data written by the host 106 during a host write operation, other memory fragments scattered throughout the source block 302-1 may be blank (e.g., having been erased by the host 106 or the controller 104 or having not been written to by the host 106).

As described, the controller 104 may be configured to identify faulty memory components, such as columns or memory blocks, of a memory die, such as the memory die 110-1. It should be understood that, while only the memory die 110-1 is described, the controller 104 may be configured to identify faulty memory components of any suitable memory die or a combination of multiple memory dies. Additionally, or alternatively, as described, the controller 104 may adjust the memory capacity of the memory die 110-1 based on the identified faulty memory components.

In some embodiments, the memory die 110-1 may include 112 word lines and 4 strings. A page size of the memory die 110-1 may be defined as the product of the number of word lines (112) and the number of strings (4) times 4. The memory die 110-1 may include 16,384 physical columns, 2,341 memory blocks, and 2 planes (e.g., plane 0 and plane 1, as described). The memory capacity of the memory die 110-1 may be defined as the product of the number of memory blocks (2,341), the page size (112*4*4), the number columns (16,384), and the number of planes (2) (e.g., 137 gigabyte). It should be understood that the memory die 110-1 may have any suitable memory capacity, number of word lines, number of strings, page size, number of physical columns, number of memory blocks, and/or number of planes than those described herein. In some embodiments, the memory die 110-1 may be one of multiple memory dies in an 8-memory die package having a capacity of 1 terabyte, or any suitable configured package having any suitable memory capacity.

In some embodiments, the controller 104 may be configured to identify faulty columns of the memory die 110-1. For example, the memory die 110-1 may include 16 thousand physical columns (e.g., or any other suitable number of physical columns). The controller 104 may be configured to identify memory segments of the memory die 110-1. For example, the controller 104 may divide the memory die 110-1 into bundles (e.g., memory segments). The controller 104 may divide the memory die 110-1 into equal memory segments. For example, the controller 104 may divide the memory die 110-1 into four memory segments each including 4 thousand physical columns. In some embodiments, the controller 104 may divide the memory die 110-1 into any suitable number of memory segments having an equal number of physical columns or an unequal number of physical columns.

In some embodiments, the controller 104 may be configured to determine a number of fault columns for each memory segment. For example, the controller 104, during performance of a memory die-sorting process, may perform a faulty column detection sequence (e.g., or technique, process, or the like). The controller 104 may identify a number of faulty columns for each memory segment during performance of the faulty column detection sequence. The controller 104 may calculate or determine a total (e.g., cumulative) number of faulty columns for the memory die 110-1. For example, the controller 104 may add the number of faulty columns detected for each of the memory segments to determine the total number of faulty columns detected for the memory die 110-1.

Figure 5:
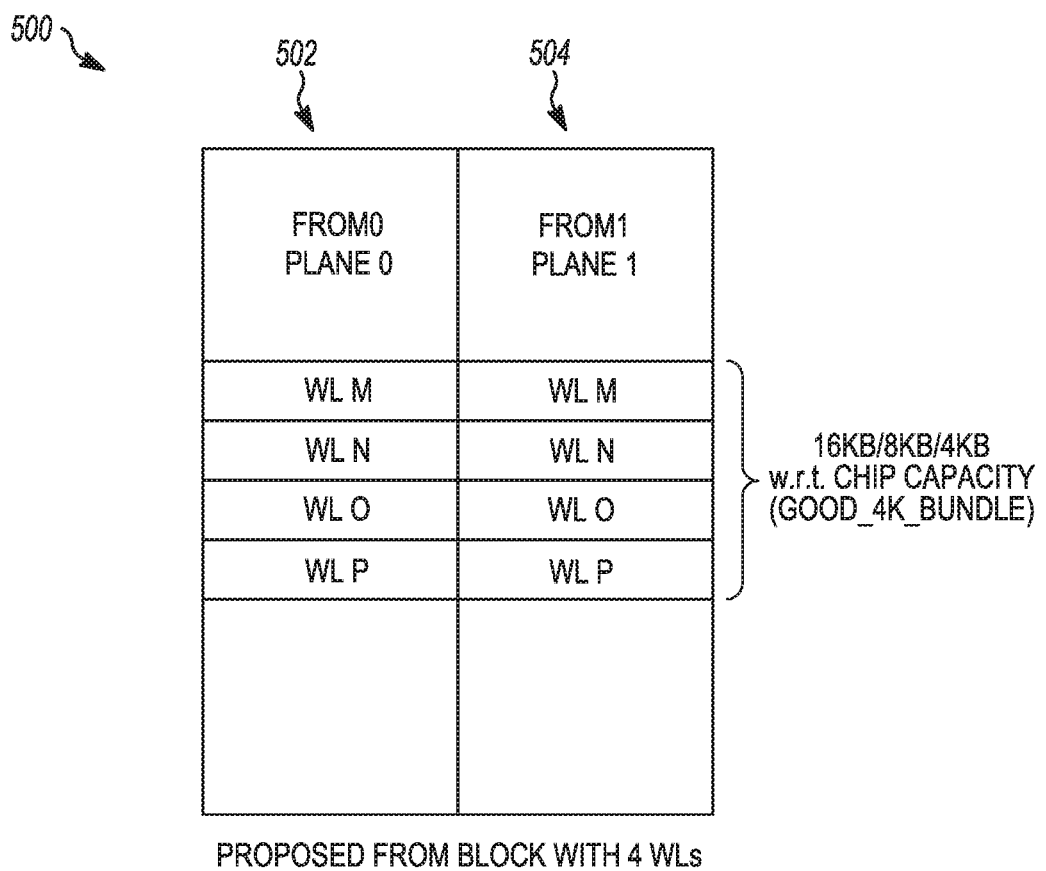
FIG. 5 generally illustrates a read only memory according to the principles of the present disclosure.

In some embodiments, the controller 104 may determine whether the total number of faulty columns for the memory die 110-1 is less than a threshold (e.g., a number of allowable or acceptable faulty columns per the memory die 110-1). If the controller 104 determines that the total number of faulty columns is less than the threshold, the controller 104 load all identified faulty columns into a ROMfuse block, such as the ROMfuse block 500 as is generally illustrated in FIG. 5, using a programming operation. The ROMfuse 500 may be referred to as FROM and may include an FROM0 502 and an FROM1 504. FROM0 502 may correspond to a plane 0 of the memory die 1101 and FROM1 502 may correspond to a plane 1 of the memory die 110-1. The ROMfuse 500 may include 4 word lines (e.g., WLM, WLN, WLO, and WLP) for each of the plane 0 and the plane 1. If the controller 104 determines that the total number of faulty columns for the memory die 110-1 is less than the threshold, the memory capacity for the memory die 110-1 is 100%.

Conversely, if the controller 104 determines that the total number of faulty columns is greater the threshold, the controller 104 may identify and filter out a memory segment of the memory segments having the highest number of faulty columns. For example, the controller 104 may compare the number of faulty columns for each of the four memory segments (e.g., or any suitable number of memory segments). The controller 104 may determine which of the memory segments includes the highest number of faulty columns. The controller 104 may disable the memory segment having the highest number of faulty columns. The memory segments may be referred to as memory segment 1, memory segment 2, memory segment 3, and memory segment 4. The possible combinations of memory segments left after identifying the memory segment with the highest number of faulty columns include: {1, 2, 3}, {1, 2, 4}, {1, 3, 4}, and {2, 3, 4}.

The controller 104 may then determine an updated total number of faulty columns for the memory die 110-1 (e.g., based on the sum of the number of faulty columns identified for the three memory segments remaining). The controller 104 determines whether the updated total number of faulty columns is less than the threshold. If the controller 104 determines that the updated total number of faulty columns is less than the threshold, the controller 104 loads all identified faulty columns into the ROMfuse block using a programming operation. If the controller 104 determines that the updated total number of faulty columns for the memory die 110-1 is less than the threshold, the memory capacity for the memory die 110-1 is 75%.

Conversely, if the controller 104 determines that the updated total number of faulty columns is greater the threshold, the controller 104 may identify and filter out a memory segment of the memory segments having the highest number of faulty columns. As described the controller 104 compares the number of faulty columns for each of the remaining memory segments and identifies the memory segment having the highest number of faulty columns. The controller 104 may disable the memory segment having the highest number of faulty columns. The possible combinations of memory segments left after identifying the memory segment with the highest number of faulty columns include: {1, 2}, {1, 3}, {1, 4}, {2, 3}, {2, 4}, and {3, 4}.

The controller 104 may then determine another updated total number of faulty columns for the memory die (e.g., based on number of faulty columns for the two memory segments remaining). The controller 104 determines whether the updated total number of faulty columns is less than the threshold. If the controller 104 determines that the updated total number of faulty columns is less than the threshold, the controller 104 loads all identified faulty columns into the ROMfuse block using a programming operation. If the controller 104 determines that the updated total number of faulty columns for the memory die 110-1 is less than the threshold, the memory capacity for the memory die 110-1 is 50%.

Conversely, if the controller 104 determines that the updated total number of faulty columns is greater the threshold, the controller 104 may identify and filter out a memory segment of the memory segments having the highest number of faulty columns. As described, the controller 104 may compare the number of faulty columns identified for the remaining two memory segments and identify the memory segment having the highest number of faulty columns. The controller 104 may disable the memory segment having the highest number of faulty columns. The possible combinations of memory segments left after identifying the memory segment with the highest number of faulty columns include: {1}, {2}, {3}, and {4}.

The controller 104 may determine another updated total number of faulty columns for the memory die (e.g., based on the number of faulty columns for the one memory segment remaining). The controller 104 may determine whether the updated total number of faulty columns is less than the threshold. If the controller 104 determines that the updated total number of faulty columns is less than the threshold, the controller 104 loads all identified faulty columns into the ROMfuse block using a programming operation. If the controller 104 determines that the updated total number of faulty columns for the memory die 110-1 is less than the threshold, the memory capacity for the memory die 110-1 is 25%

Conversely, if the controller 104 determines that the updated total number of faulty columns is greater the threshold, the controller 104 may determine that none of the memory segments are within the acceptable number of faulty columns and the memory die is determined to be defective (e.g., 0% of the memory die is usable).

In some embodiments, the controller 104 may use a 4-bit parameter to identify memory segments not marked as faulty (e.g., the memory segments used to determine the memory capacity of the memory die 110-1 after identifying faulty memory segments). For example, bit '1' may refer to a "good" memory segment and bit '0' may refer to a "bad" (e.g., discarded of faulty) memory segment.

In some embodiments, the controller 104 may be configured to identify faulty memory blocks of the memory die 110-1. The faulty memory blocks may be randomly distributed or distributed in clusters in a top area of a memory plane (e.g., plane 0 or plane 1), a bottom area of a memory plane (e.g., plane 0 or plane 1), ad/or a center area of a memory plane (e.g., plane 0 or plane 1).

The controller 104 may be configured to perform a memory test at a production factor (e.g., during manufacturing of the memory die 110-1) or any suitable time (e.g., in use by an operator of the storage system 102). The controller 104, during performance of the memory test) may identify memory segments of the memory die 110-1. The memory segments may correspond to plane 0, plane 1, a top half of plane 0, a top half of plane 1, a bottom half of plan 0, a bottom half of plane 1, any suitable area of either or both of the plane 0 or plane 1, or any combination thereof. As is generally illustrated in FIGS. 7A-7J, the controller 104 may be configured to identify faulty memory blocks of the memory segments of the memory die 110-1, during performance of the memory test.

The controller 104 may determine a total number of faulty memory blocks for the memory die 110-1. For example, the controller 104 may add the number of faulty memory bocks for each memory segment to determine the total number of faulty memory blocks for the memory die 1101-1. The controller 104 determines whether the total of faulty memory blocks for the memory die 110-1 is greater than a threshold (e.g., an acceptable number of faulty memory blocks). If the controller 104 determines that the total number of faulty memory blocks is less than the threshold, the controller 104 may indicate that the memory capacity for the memory die 110-1 is 100%.

Conversely, if the controller 104 determines that the total number of faulty memory blocks is greater than the threshold, the controller 104 may identify a memory segment having the highest number of faulty memory blocks. The controller may be configured to selectively adjust the memory capacity of the memory die 110-1. For example, the memory capacity of a 32 gigabyte memory die may be adjusted to 16 gigabyte, 8 gigabyte, and so on. In some embodiments, the memory die 101-1 may include a programmable block address decoder circuit that allows part of the memory die 1101-1 to be isolated and disable. For example, the controller 104 may isolate and disable a quarter, a half, or three quarters of the memory die 1101-1 based on the number of detected faulty memory blocks and how the faulty memory blocks are distributed and/or clustered in the memory die 1101-1.

Figure 7A:
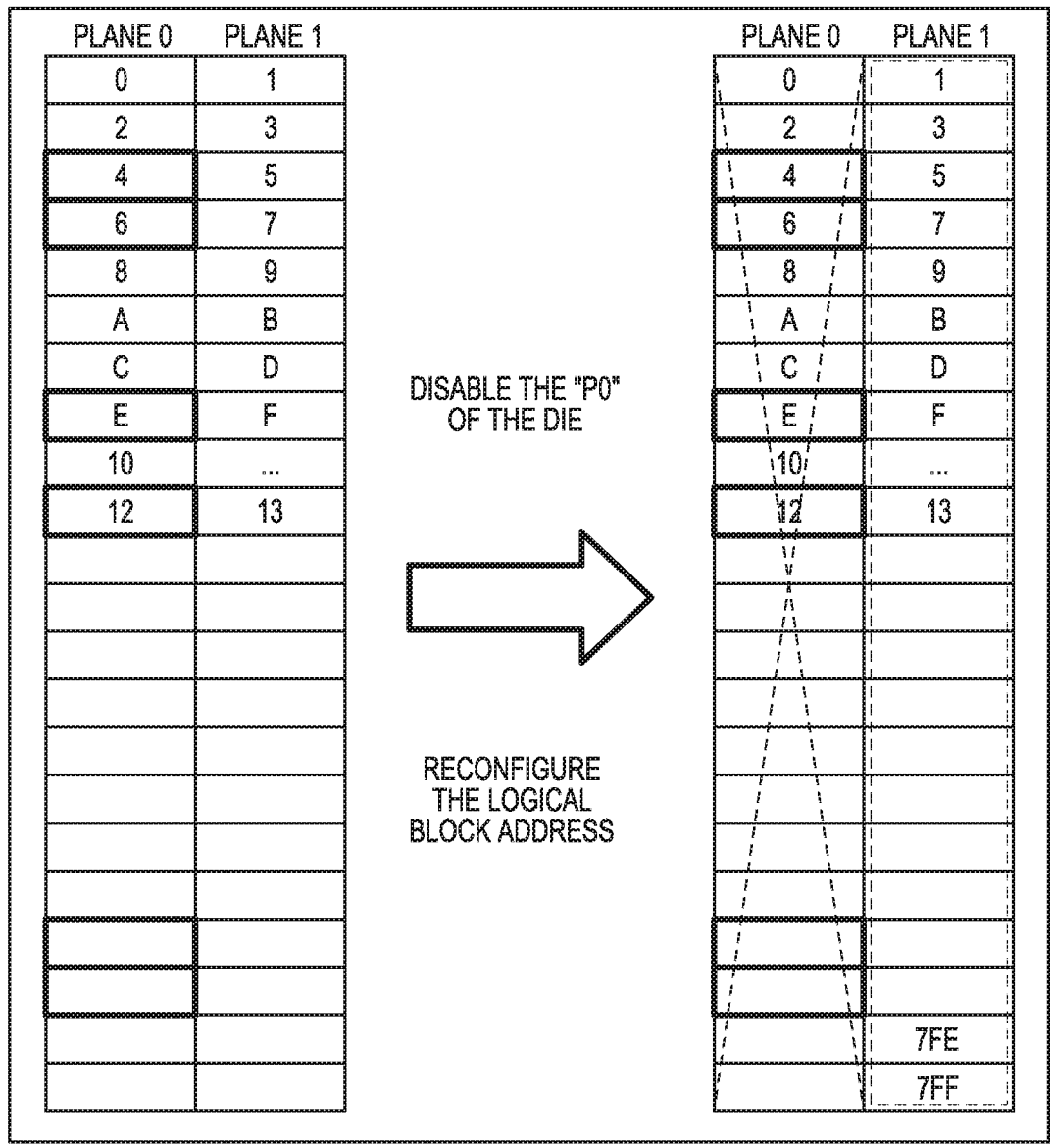
FIGS. 7A-7J generally illustrate various memory plane configurations according to the principles of the present disclosure.
Figure 7B:
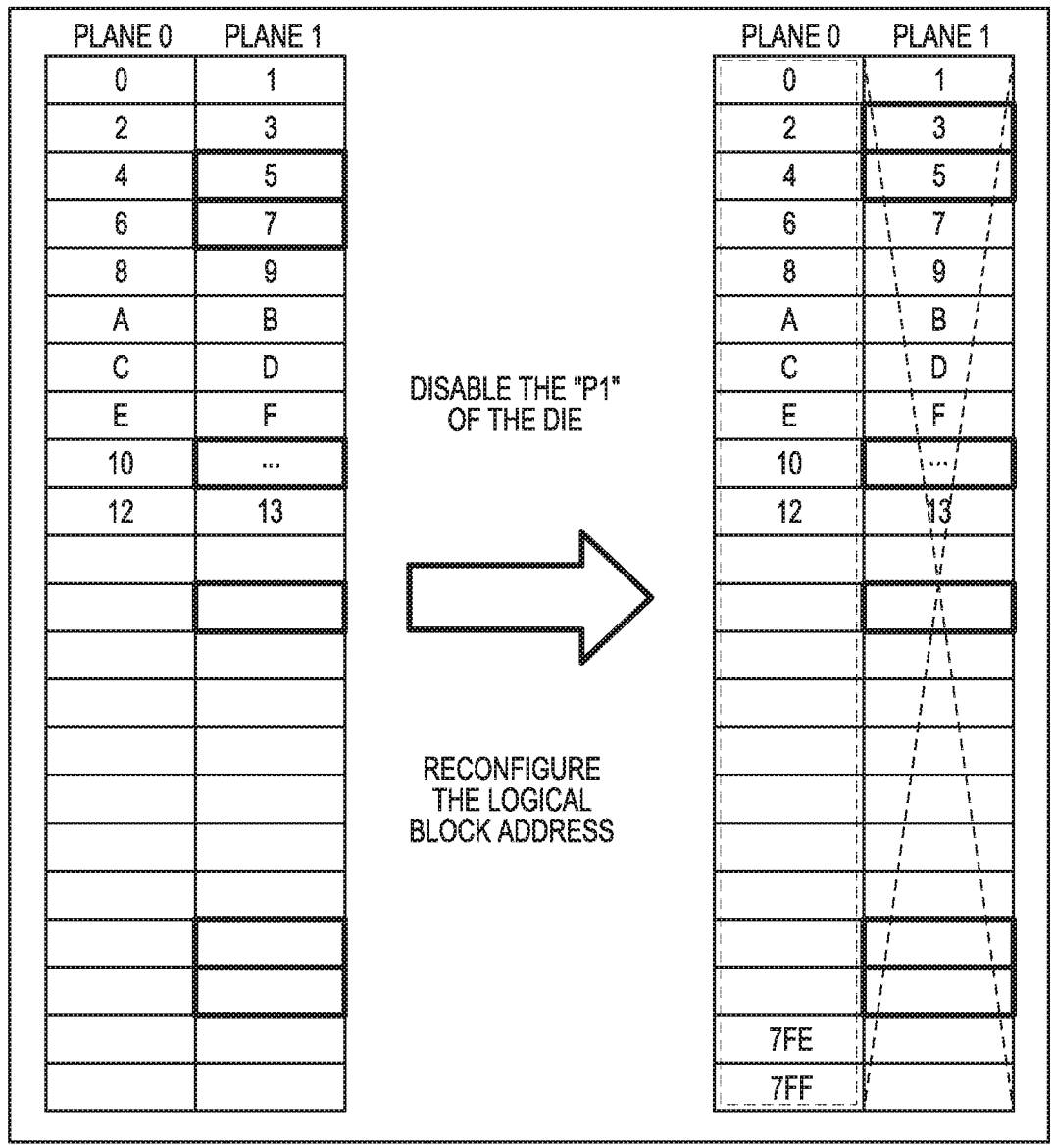

As is generally illustrated in FIG. 7A, the controller 104 may determine that the plane 0 includes the highest number of faulty memory blocks. The controller 104 may disable the plane 0. If the controller 104 determines that the plane 0 includes the highest number of faulty memory blocks, the memory capacity of the memory die 110-1 is 50%. Conversely, the controller 104 may determine that the plane 1 includes highest number of faulty memory blocks, as is generally illustrated in FIG. 7B. The controller 104 may disable the memory plane 1. If the controller 104 determines that the plane 1 includes the highest number of faulty memory blocks, the memory capacity of the memory die 110-1 is 50%.

Figure 7C:
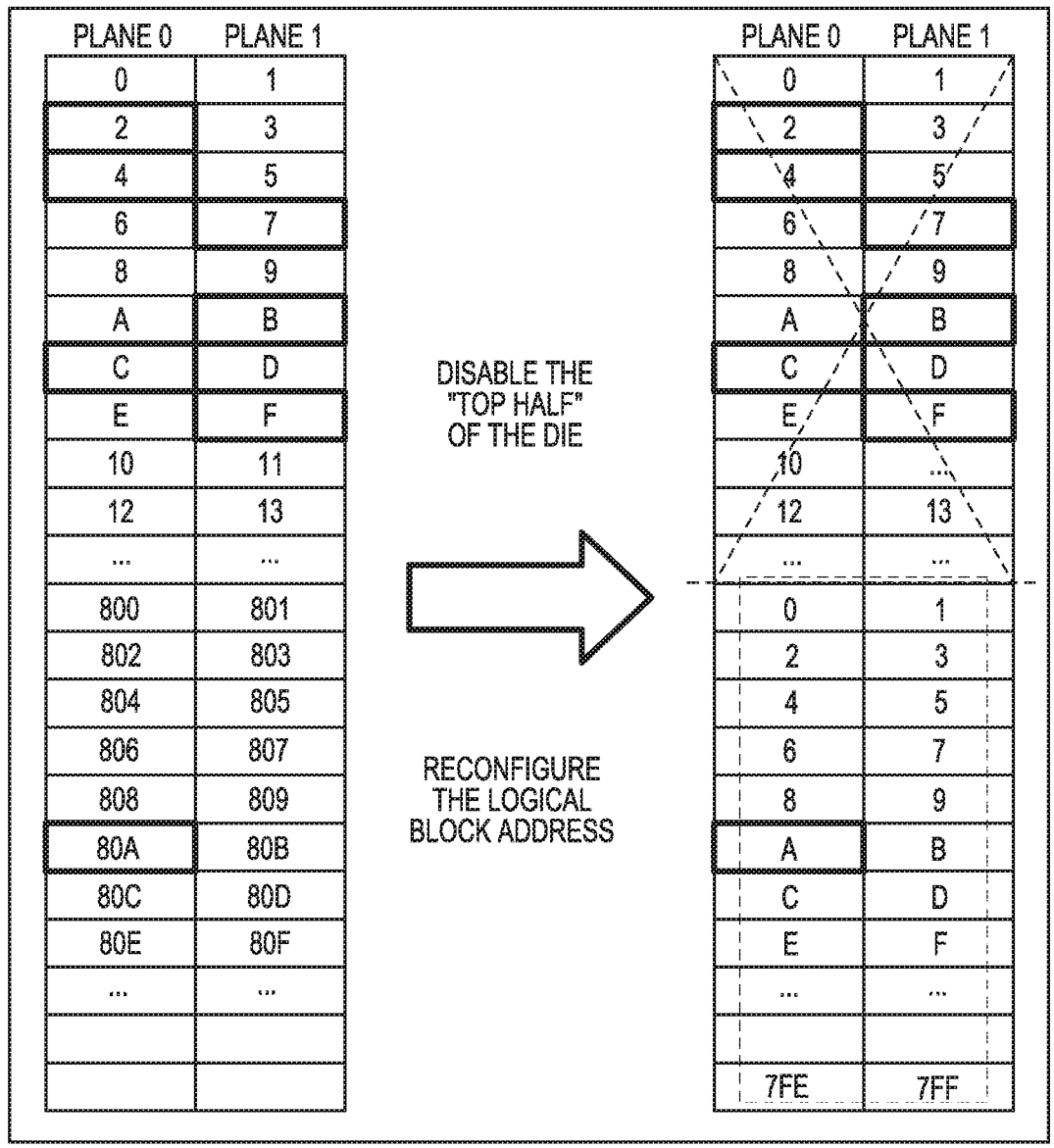
Figure 7D:
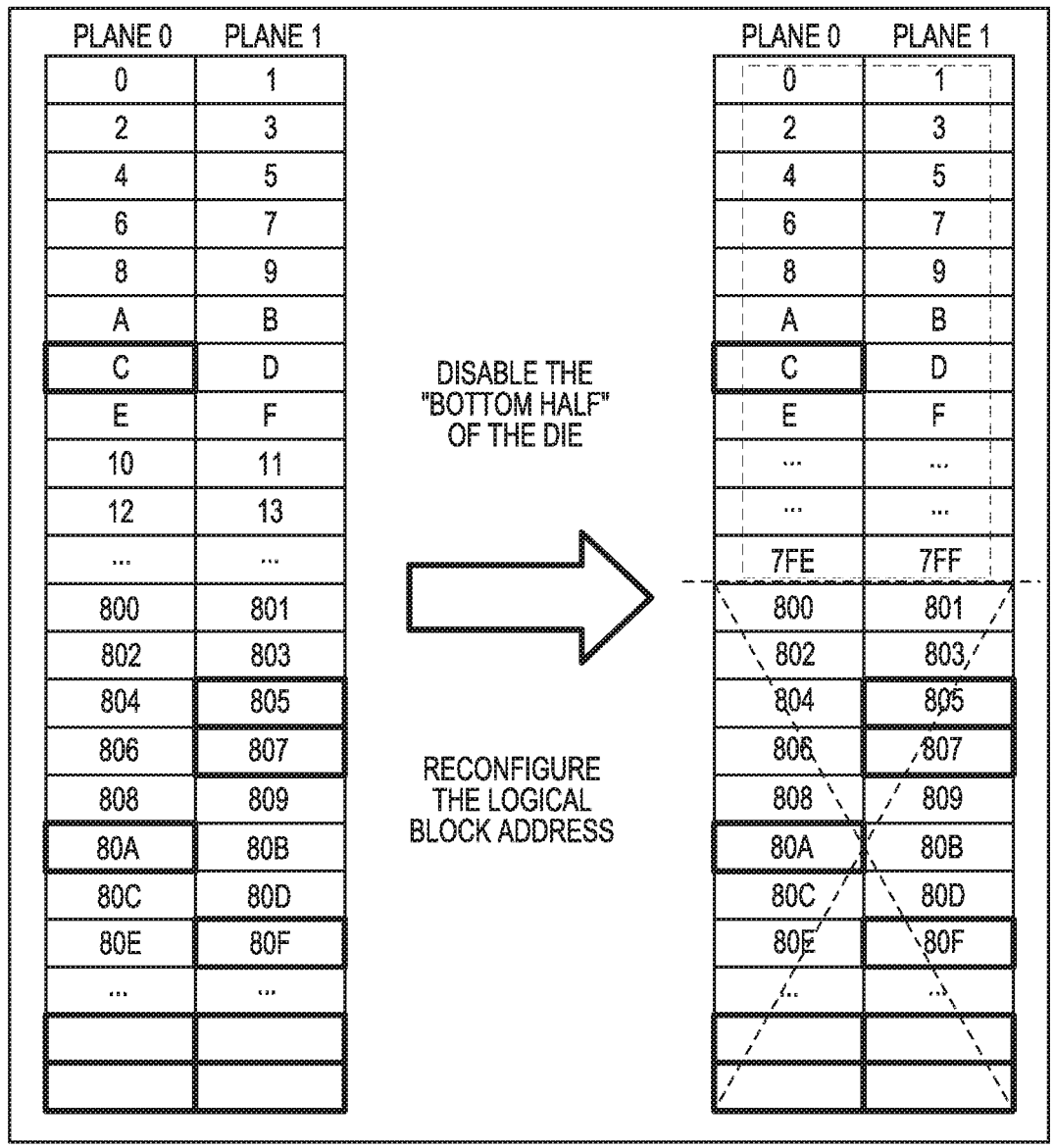

As is generally illustrated in FIG. 7C, the controller 104 may determine that the top half of the plane 0 and the top half of the plane 1 include the highest number of faulty memory blocks. The controller 104 may disable the top half of the plane 0 and the top half of the plane 1. If the controller 104 determines that the top half of the plane 0 and the top half of the plane 1 include the highest number of faulty memory blocks, the memory capacity of the memory die 110-1 is 50%. As is generally illustrated in FIG. 7D, the controller 104 may determine that the bottom half of the plane 0 and the bottom half of the plane 1 include the highest number of faulty memory blocks. The controller 104 may disable the bottom half of the plane 0 and the bottom half of the plane 1. If the controller 104 determines that the bottom half of the plane 0 and the bottom half of the plane 1 include the highest number of faulty memory blocks, the memory capacity of the memory die 110-1 is 50%.

Figure 7E:
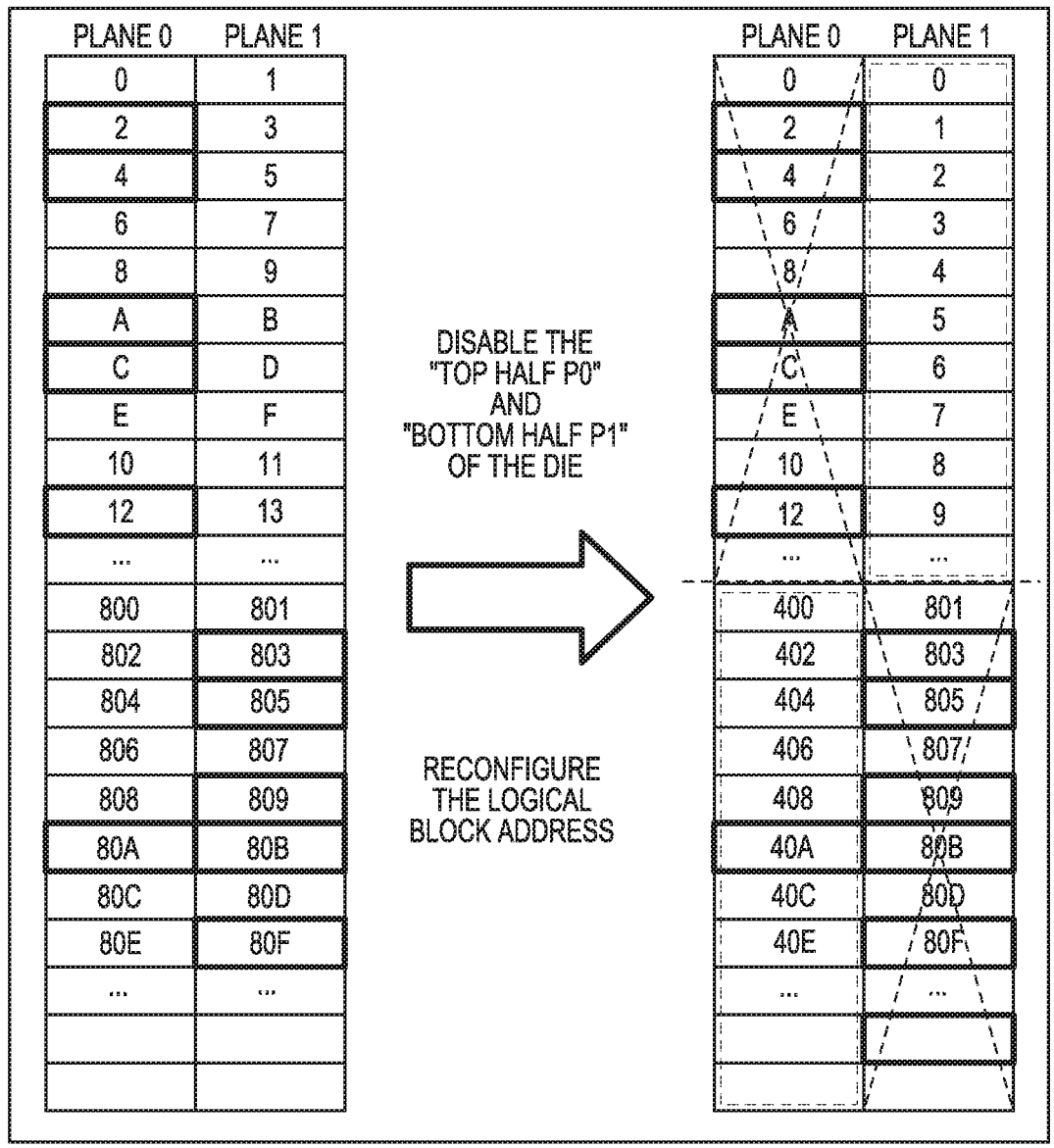

As is generally illustrated in FIG. 7E, the controller 104 may determine that the top half of the plane 0 and the bottom half of the plane 1 include the highest number of faulty memory blocks. The controller 104 may disable the top half of the plane 0 and the bottom half of the plane 1. If the controller 104 determines that the top half of the plane 0 and the bottom half of the plane 1 include the highest number of faulty memory blocks, the memory capacity of the memory die 110-1 is 50%.

Figure 7F:
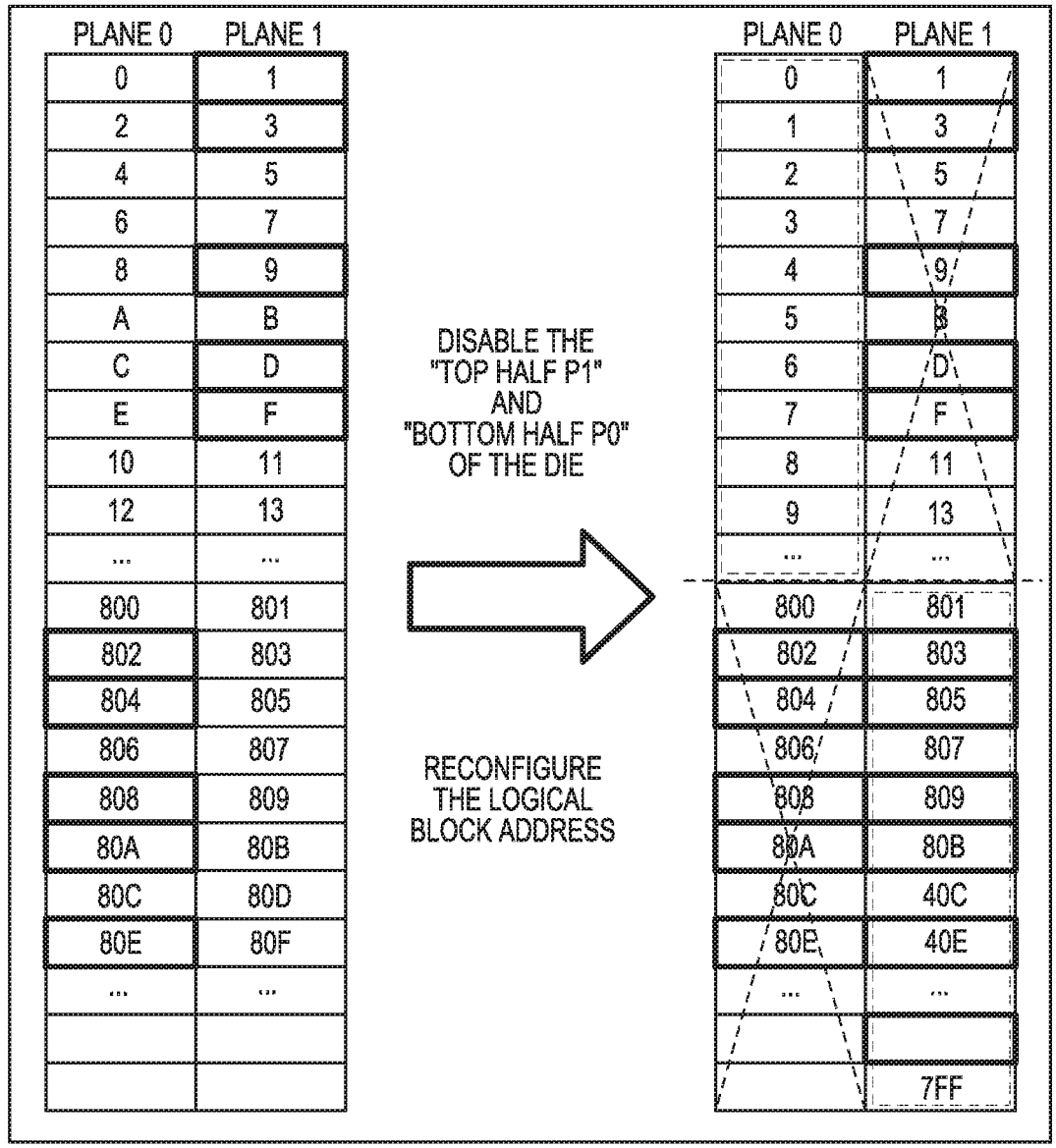

As is generally illustrated in FIG. 7F, the controller 104 may determine that the bottom half of the plane 0 and the top half of the plane 1 include the highest number of faulty memory blocks. The controller 104 may disable the bottom half of the plane 0 and the top half of the plane 1. If the controller 104 determines that the bottom half of the plane 0 and the top half of the plane 1 include the highest number of faulty memory blocks, the memory capacity of the memory die 110-1 is 50%.

Figure 7G:
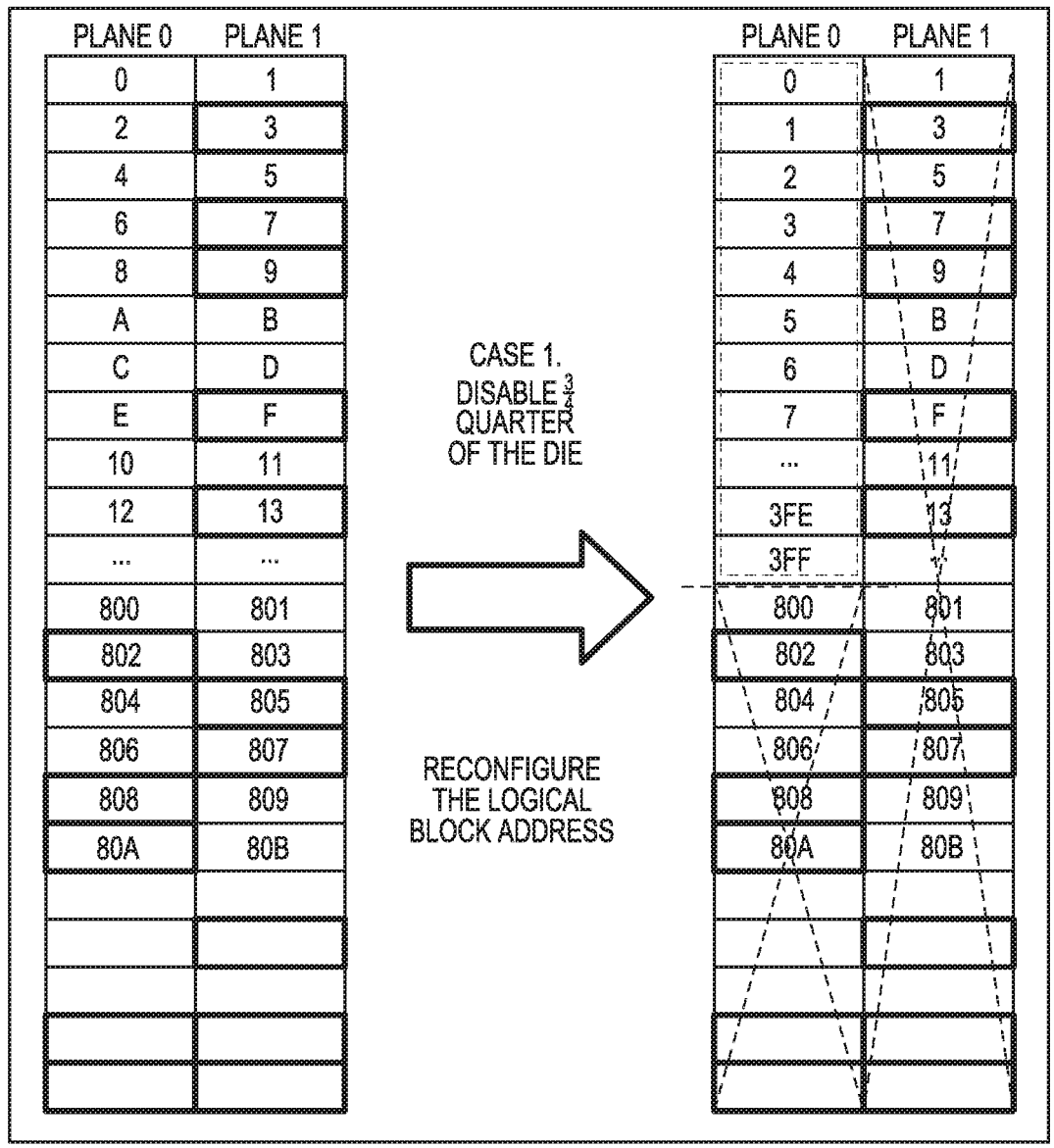

As is generally illustrated in FIG. 7G, the controller 104 may determine that the bottom half of the plane 0 and the plane 1 include the highest number of faulty memory blocks. The controller 104 may disable the bottom half of the plane 0 and the plane 1. If the controller 104 determines that the bottom half of the plane 0 and the plane 1 include the highest number of faulty memory blocks, the memory capacity of the memory die 110-1 is 25%.

Figure 7H:
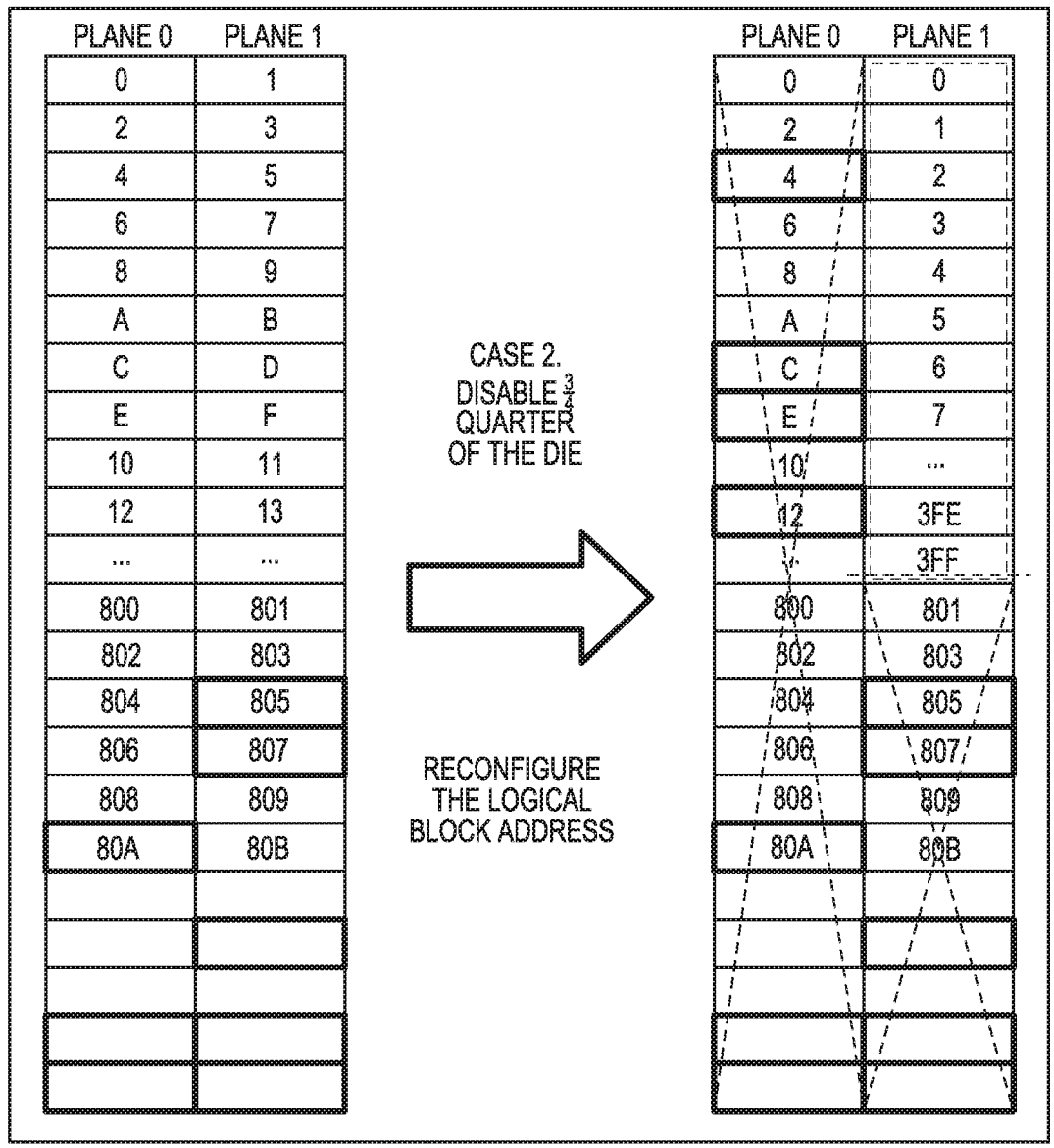

As is generally illustrated in FIG. 7H, the controller 104 may determine that the plane 0 and the bottom half of the plane 1 include the highest number of faulty memory blocks. The controller 104 may disable the plane 0 and the bottom half of the plane 1. If the controller 104 determines that the plane 0 and the bottom half of the plane 1 include the highest number of faulty memory blocks, the memory capacity of the memory die 110-1 is 25%.

Figure 7I:
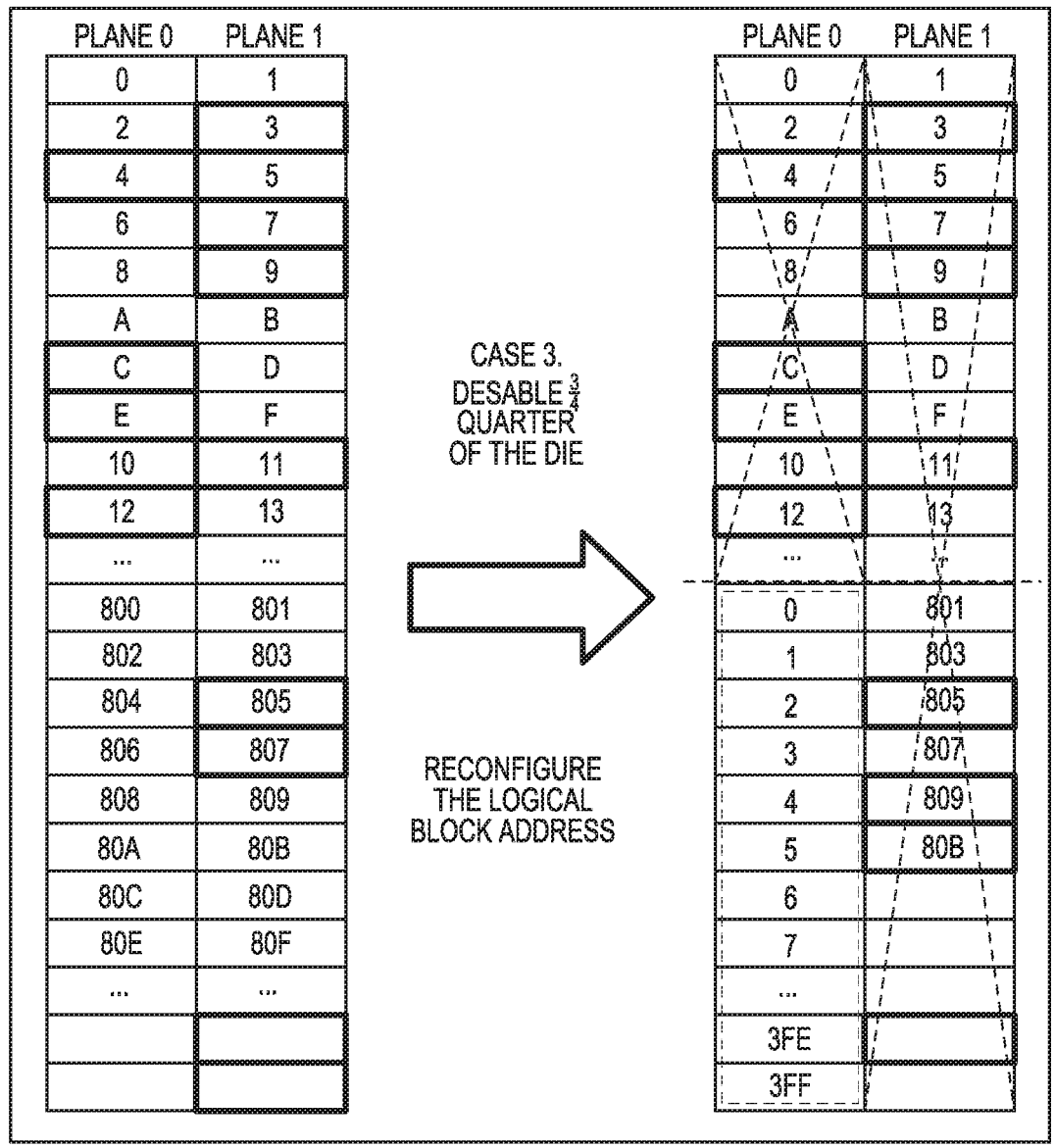

As is generally illustrated in FIG. 7I, the controller 104 may determine that the top half of the plane 0 and the plane 1 include the highest number of faulty memory blocks. The controller 104 may disable the top half of the plane 0 and the plane 1. If the controller 104 determines that the top half of the plane 0 and the plane 1 include the highest number of faulty memory blocks, the memory capacity of the memory die 110-1 is 25%.

Figure 7J:
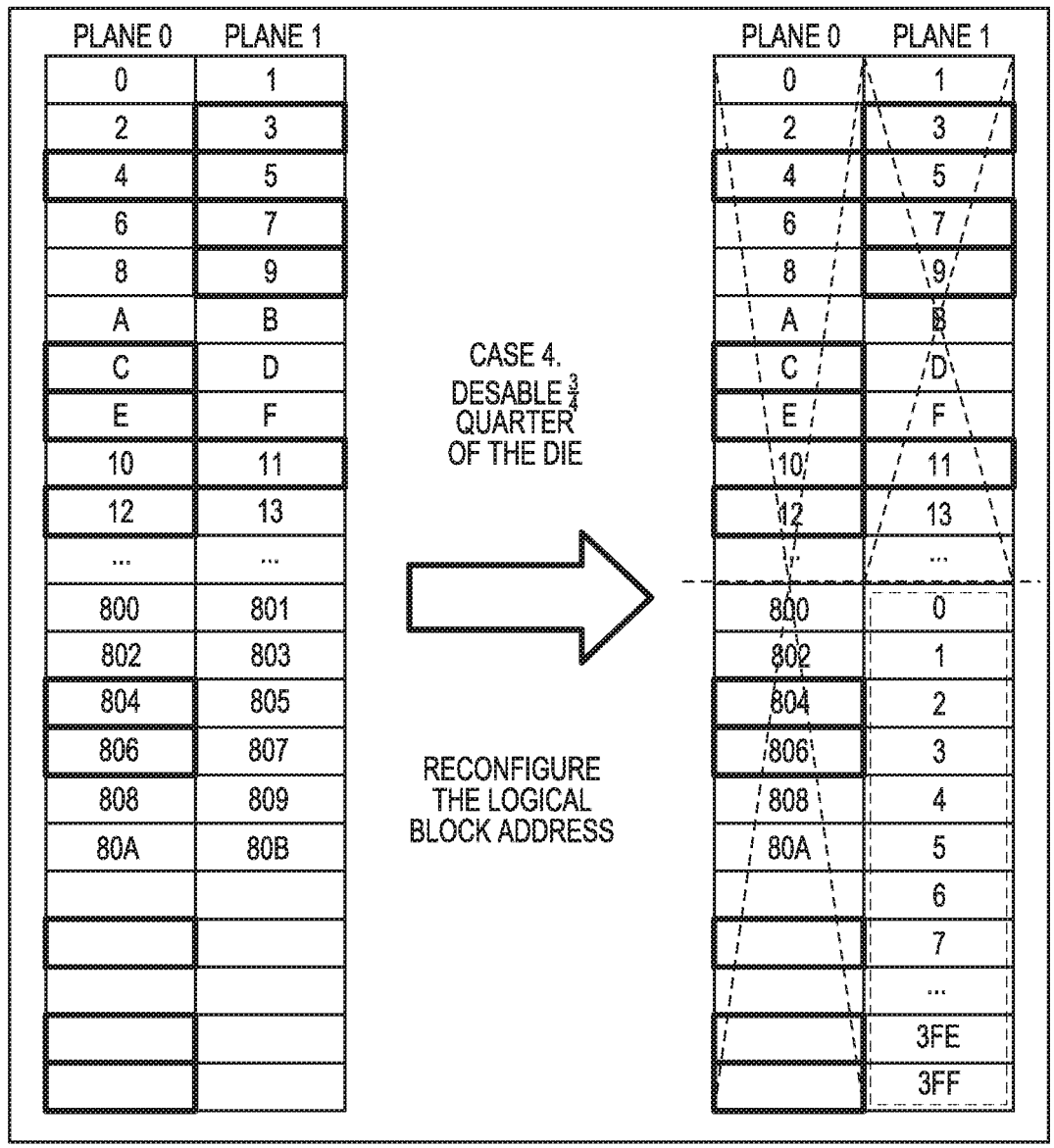

As is generally illustrated in FIG. 7J, the controller 104 may determine that the plane 0 and the top half of the plane 1 include the highest number of faulty memory blocks. The controller 104 may disable the plane 0 and the top half of the plane 1. If the controller 104 determines that the plane 0 and the v half of the plane 1 include the highest number of faulty memory blocks, the memory capacity of the memory die 110-1 is 25%.

As is generally illustrated in FIGS. 8A-8E, the controller 104 may use the 4-bit parameter to indicate (e.g., or define) capacity (e.g., the enabled and disabled memory segments) of the memory die 110-1. For example, the 4-bit parameter may include a first bit A, a second bit B, a third bit C, and a fourth bit D. As described, a bit '1' may indicated an enabled memory segment and a bit '0' may indicate a disabled memory segment.

If the controller 104 disables the plane 1, the controller 104 sets the 4-bit parameter to A=1, B=1, C=0, D=0. If the controller 104 disables the plane 0, the controller 104 sets the 4-bit parameter to A=0, B=0, C=1, D=1. If the controller 104 disables the top half of the plane 0 and the top half of the plane 1, the controller 104 sets the 4-bit parameter to A=0, B=1, C=0, D=1. If the controller 104 disables the bottom half of the plane 0 and the bottom half of the plane 1, the controller 104 sets the 4-bit parameter to A=1, B=0, C=1, D=0. If the controller 104 disables the top half of the plane 0 and the bottom half of the plane 1, the controller 104 sets the 4-bit parameter to A=0, B=1, C=1, D=0. If the controller 104 disables the bottom half of the plane 0 and the top half of the plane 1, the controller 104 sets the 4-bit parameter to A=1, B=0, C=0, D=1. If the controller 104 disables the bottom half of the plane 0 and the plane 1, the controller 104 sets the 4-bit parameter to A=1, B=0, C=0, D=0. If the controller 104 disables the top half of the plane 0 and the plane 1, the controller 104 sets the 4-bit parameter to A=0, B=1, C=0, D=0. If the controller 104 disables the plane 0 and the bottom half of the plane 1, the controller 104 sets the 4-bit parameter to A=0, B=0, C=1, D=0. If the controller 104 disables the plane 0 and the top half of the plane 1, the controller 104 sets the 4-bit parameter to A=0, B=0, C=0, D=1.

In some embodiments, the controller 104 may perform the methods described herein. However, the methods described herein as performed by the controller 104 are not meant to be limiting, and any type of software executed on a controller can perform the methods described herein without departing from the scope of this disclosure. For example, a controller such as a processor executing software within the host 106 or firmware within the storage system 102 (e.g., stored on ROM 232 or NVM memory block 110) can perform the methods described herein.

Figure 9:
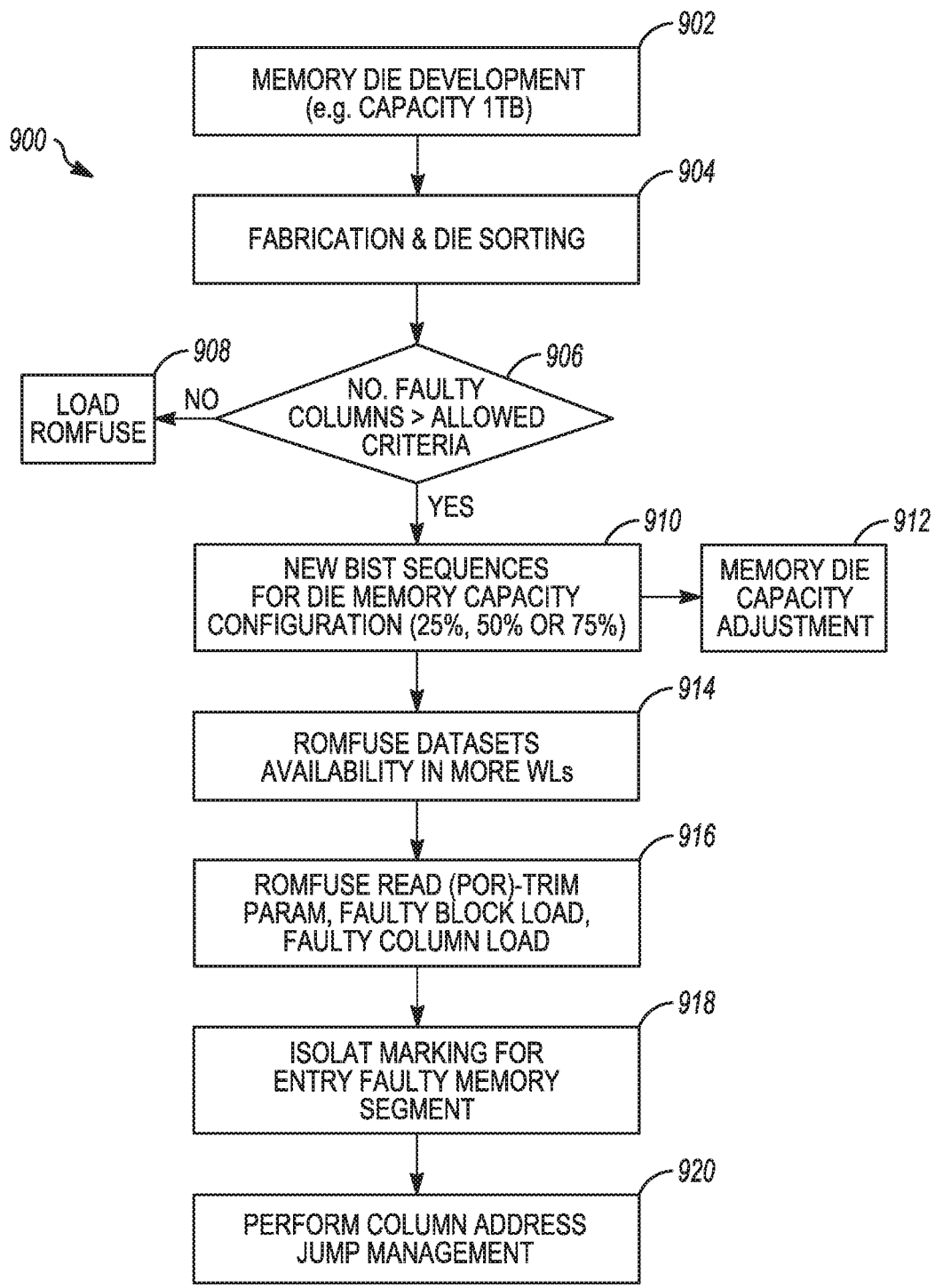
FIG. 9 is a flow diagram generally illustrating a memory management method according to the principles of the present disclosure.

FIG. 9 is a flow diagram generally illustrating a memory management method 900 according to the principles of the present disclosure. At 902, the method 900 performs memory die development. For example, during a manufacturing process, the memory die 110-1 may be manufactured. As describe, the memory die 110-1 may be one of multiple memory dies in a package having a memory capacity of 1 terabyte, or other suitable package or memory capacity. At 904, the method 900 fabricates and sorts the memory die. For example, during the manufacturing process, the memory 110-1 may be fabricated and sorted. Additionally, or alternatively, the controller 104 may identify a number of faulty columns of the memory die 110-1 as described.

At 906, the method 900 determines whether the number of faulty columns are greater than the allowed criteria. For example, the controller 104 determines whether the total number of faulty columns (e.g., based on the number of faulty columns for each memory segment identified for the memory die 110-1) for the memory die 110-1 is greater than the threshold. If the controller 104 determines that the total number of faulty columns is not greater than the threshold, the method continues at 908. At 908, the method 900 loads the faulty columns to the ROMfuse. For example, the controller 104 loads the faulty columns to the ROMfuse. If the controller 104 determines, at 906, that the total number of faulty columns is greater than the threshold, the method 900 continues at 910.

At 910, the method 900 performs a built-in self-test to determine the memory capacity of the memory die (e.g., 25%, 50%, or 75%). For example, the controller 104 determines the memory capacity of the memory die 110-1 based on the number of faulty columns for each memory segment, as described. At 912, the method 900 adjusts the memory capacity of the memory die. For example, the controller 104 may set the 4-bit parameter according to the enabled and disabled memory segments of the memory die 110-1. At 914 and 916, the method 900 uses the ROMfuse datasets for word lines of the memory die. For example, the controller 104 loads faulty columns of the enabled memory segments to a ROMfuse, such as the ROMfuse 500.

The ROMfuse 500 may be programmed to target a relatively higher POR success rate.

Figure 4:
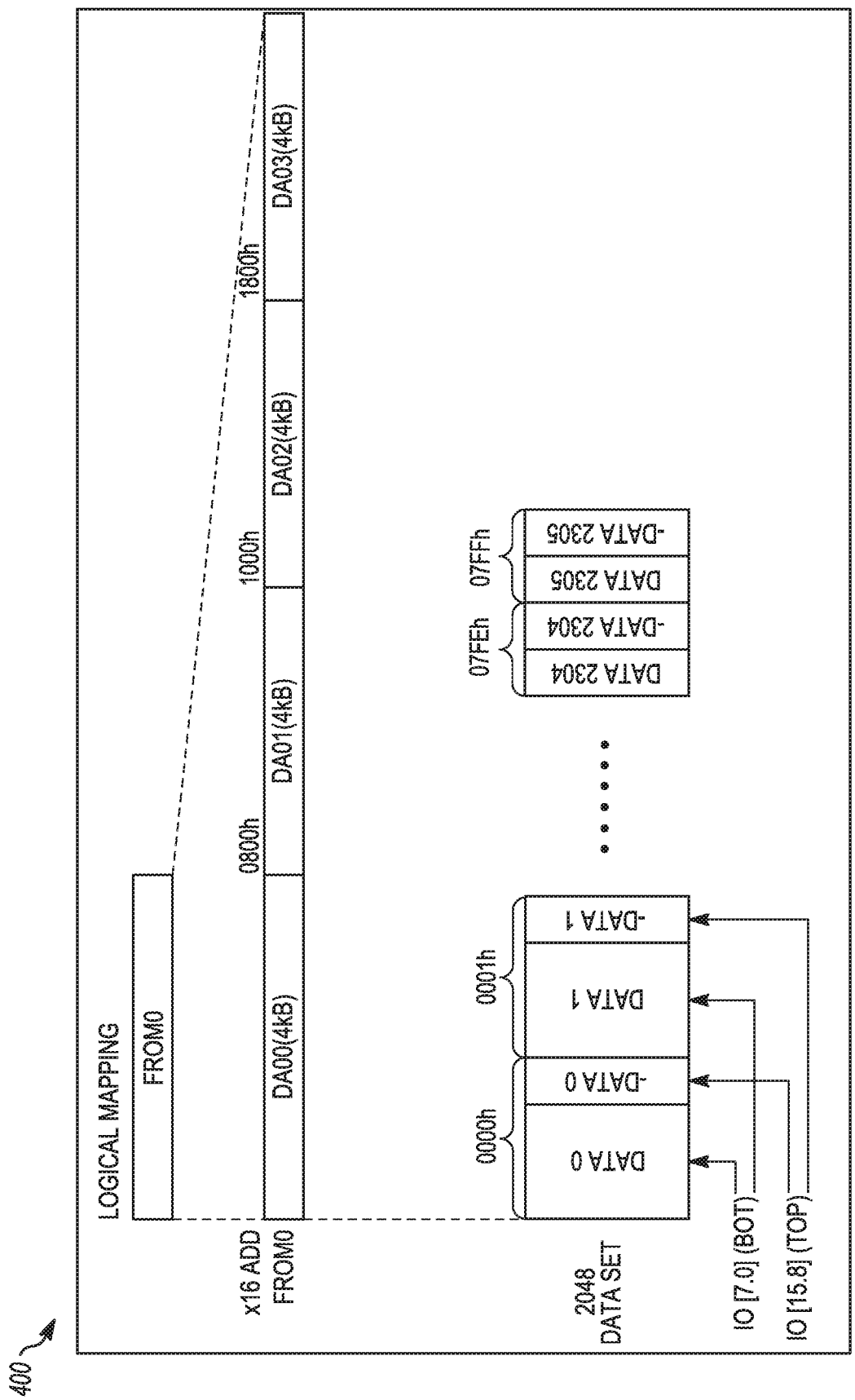
FIG. 4 generally illustrates a POR dataset according to the principles of the present disclosure.

Traditionally ROMfuse programming is performed on a 16K page size with four 4 KB size of datasets in single wordline as is generally illustrated in FIG. 4. The POR operation is successful only when at least 2 datasets are identical. For example, if the page size of the memory die 1101-1 is less than 12K, POR success rate may become challenging (e.g., 75% or 12K page size store only 3 datasets, 50% or 8K page size store only 2 datasets, 25% or 4K page size store only one dataset). The chances of POR failure (e.g., the memory die 110-1 will not be usable) may increase for lower capacities of the memory die 110-1 or for smaller page size memory dies.

To overcome the POR challenges, the controller 104 programs the ROMfuse information in 4 different word lines (e.g., WLM, WLN, WLO, WLP) of the ROMfuse 500. The 4 word lines may provide, such that a safe margin of 8 word lines difference between WLM and WLN is considered (e.g., to avoid any read disturbs or coupling noise with safe margin). Based on 4-bit parameter setting, as described, the POR operation is performed on multiple word lines (e.g., WLM, WLN, WLO, WLP) using an EXOR result of datasets in WLM to target a successful POR with two datasets (4 KB size) to be identical. The datasets may be distributed in 4 selected word lines to support different page size (e.g., 16 KB/12 KB/8 KB/4 KB) configurations as is generally illustrated in FIG. 6.

At 918, the method 900 performs an ISOLAT marking for the entire faulty memory segment. For example, a POR operation, the controller 104 sets isolation latches for all columns in faulty (e.g., disabled) memory segment (e.g., such that a bit scan is skipped for those columns from faulty memory segments during detection of a program operation, which may save bit scan time and adds value for program correct status, because a total number of active columns is less than 16K). At 920, the method 900 performs column address jump management. For example, if the controller 104 sets the 4-bit parameter to A=1, B=1, C=0, D=1 (e.g., the third memory segment is faulty), the controller 104 changes column addressing for the third memory segment, such that 8K to 12K column addresses are forbidden for user data-in (e.g., write operations) and data-out (e.g., read operations). The forbidden address control may be implemented in SYNTOP, such that, for example, the column address jump will occur from 8K to 12K instead of 8K to 8K+1.

Figure 10:
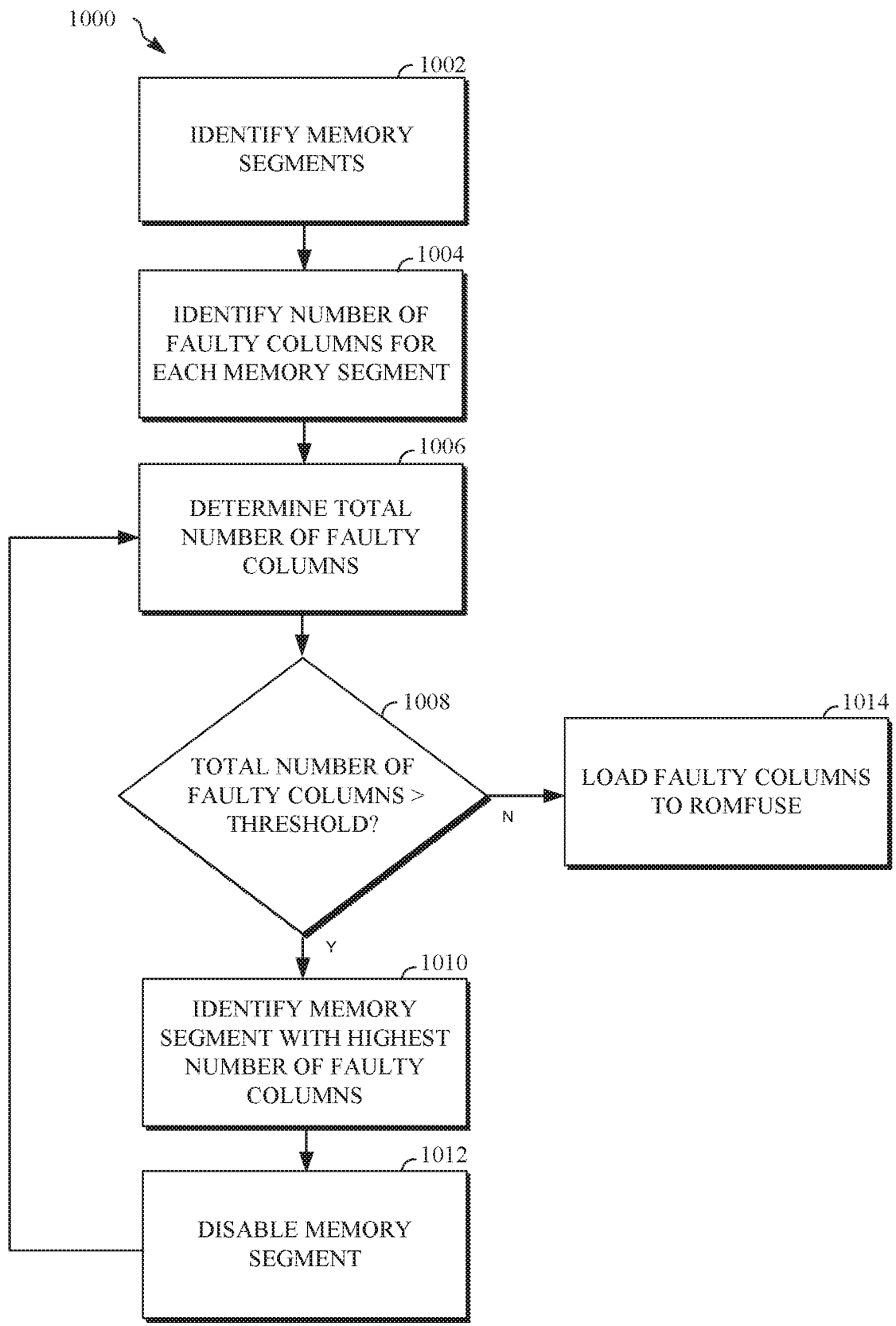
FIG. 10 is a flow diagram generally illustrating an alternative memory management method according to the principles of the present disclosure.

FIG. 10 is a flow diagram generally illustrating an alternative memory management method 1000 according to the principles of the present disclosure. At 1002, the method 1000 identifies memory segments. For example, the controller 104 identifies memory segments of the memory die 110-1. At 1004, the method 1000 identifies a number of faulty columns or each memory segment. For example, the controller 104 identifies the number of faulty columns for each memory segment of the memory die 110-1.

At 1006, the method 1000 determines a total number of faulty columns. For example, the controller 104 adds the number of faulty columns for each memory segment to determine the total number of faulty columns for the memory die 110-1. At 1008, the method 1000 determines whether the total number of faulty columns is greater than a threshold. For example, the controller 104 determines whether the total number of faulty columns for the memory die 110-1 is greater than the threshold. If the controller 104 determines that the total number of faulty columns is not greater than the threshold, the method 1000 continues at 1014. If the controller 104 determines that the total number of faulty columns is greater than the threshold, the method 1000 continues at 1010.

At 1010, the method 1000 identifies a memory segment with the highest number of faulty columns. For example, the controller 104 identifies the memory segment having the highest number of faulty columns. At 1012, the method 1000 disables the memory segment. For example, the controller 104 disables the memory segment. The method continues at 1006. At 1014, the method 1000 loads the faulty columns to ROMfuse. For example, the controller 104 loads the faulty columns for the remaining memory segments to the ROMfuse 500.

Figure 11:
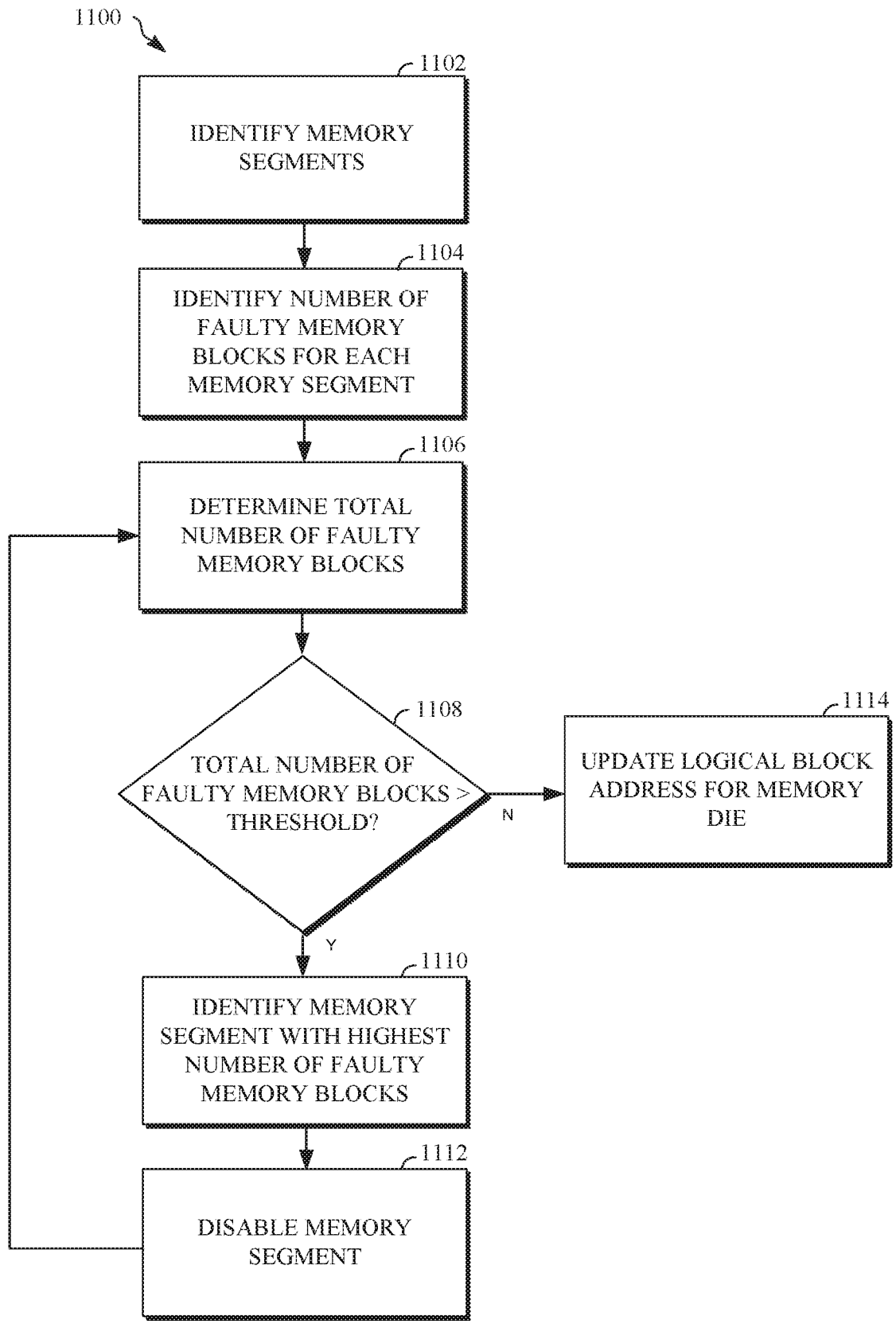
FIG. 11 is a flow diagram generally illustrating an alternative memory management method according to the principles of the present disclosure.

FIG. 11 is a flow diagram generally illustrating an alternative memory management method 1100 according to the principles of the present disclosure. At 1102, the method 1100 identifies memory segments. For example, the controller 104 identifies memory segments of the memory die 110-1. At 1104, the method 1100 identifies a number of faulty memory blocks or each memory segment. For example, the controller 104 identifies the number of faulty memory blocks for each memory segment of the memory die 110-1.

At 1106, the method 1100 determines a total number of faulty memory blocks. For example, the controller 104 adds the number of faulty memory blocks for each memory segment to determine the total number of faulty memory blocks for the memory die 110-1. At 1108, the method 1100 determines whether the total number of faulty memory blocks is greater than a threshold. For example, the controller 104 determines whether the total number of faulty memory blocks for the memory die 110-1 is greater than the threshold. If the controller 104 determines that the total number of faulty memory blocks is not greater than the threshold, the method 1100 continues at 1114. If the controller 104 determines that the total number of faulty memory blocks is greater than the threshold, the method 1100 continues at 1110.

At 1110, the method 1100 identifies a memory segment with the highest number of faulty memory blocks. For example, the controller 104 identifies the memory segment having the highest number of faulty memory blocks. At 1112, the method 1100 disables the memory segment. For example, the controller 104 disables the memory segment. The method continues at 1106. At 1114, the method 1100 updates logical block addresses for the memory die. For example, the controller 104 updates the logical block addresses for the memory die 110-1 to reflect the enabled memory segments.

In some embodiments, a memory management method includes identifying memory segments of a memory device. The method also includes identifying, for each memory segment, a number of faulty columns. The method also includes determining a total number of faulty columns for the memory device based on the number of faulty columns for each respective memory segment. The method also includes determining whether the total number of faulty columns is greater than a threshold. The method also includes, in response to a determination that the total number of faulty columns is greater than the threshold, identifying a first memory segment of the memory segments having a highest number of faulty columns. The method also includes disabling the first memory segment.

In some embodiments, the method also includes determining an updated total number of faulty columns for the memory device based on the number of faulty columns for other memory segments of the memory segments. In some embodiments, the method also includes, in response to a determination that the updated total number of faulty columns for the memory device is less than the threshold, loading faulty columns of the other memory segments to a read only memory. In some embodiments, the method also includes, in response to a determination that the updated total number of faulty columns for the memory device is greater than the threshold, identifying a second memory segment of the other memory segments having a highest number of faulty columns. In some embodiments, the method also includes disabling the second memory segment. In some embodiments, the memory device includes 16 thousand columns. In some embodiments, the memory segments include 4 thousand columns. In some embodiments, identifying, for each memory segment, the number of faulty columns includes identifying, during performance of a built-in self-test operation, the number of faulty columns for each memory segment.

In some embodiments, a controller includes a bus interface in communication with one or more memory blocks of a memory system and a processor. The processor is configured to: identify memory segments of a memory block of the one or more memory blocks; identify, for each memory segment, a number of faulty columns; determine a total number of faulty columns for the memory block based on the number of faulty columns for each respective memory segment; determine whether the total number of faulty columns is greater than a threshold; in response to a determination that the total number of faulty columns is greater than the threshold, identify a first memory segment of the memory segments having a highest number of faulty columns; and disable the first memory segment.

In some embodiments, the processor is further configured to determine an updated total number of faulty columns for the memory block based on the number of faulty columns for other memory segments of the memory segments. In some embodiments, the processor is further configured to, in response to a determination that the updated total number of faulty columns for the memory block is less than the threshold, load faulty columns of the other memory segments to a read only memory. In some embodiments, the processor is further configured to, in response to a determination that the updated total number of faulty columns for the memory block is greater than the threshold; identify a second memory segment of the other memory segments having a highest number of faulty columns. In some embodiments, the processor is further configured to disable the second memory segment. In some embodiments, the memory block includes four memory segments. In some embodiments, a capacity of the memory block is adjusted in response to the first memory segment being disabled. In some embodiments, the processor is further configured to identify, during performance of a built-in self-test operation, the number of faulty columns for each memory segment.

In some embodiments, a memory management system a memory die and a controller means. The memory die includes a plurality of planes. The controller means in communication with the at least one memory die, the controller means configured for: identifying memory segments of each plane of the plurality of planes; identifying, for each memory segment, a number of faulty memory blocks; determining a total number of faulty memory blocks for the memory die based on the number of faulty memory blocks for each respective memory segment; determining whether the total number of faulty memory blocks is greater than a threshold; in response to a determination that the total number of faulty memory blocks is greater than the threshold, identifying a first memory segment of the memory segments having a highest number of faulty memory blocks; and disabling the first memory segment.

In some embodiments, the controller means is further configured for determining an updated total number of faulty memory blocks for the memory die based on the number of faulty memory blocks for other memory segments of the memory segments. In some embodiments, the controller means is further configured for, in response to a determination that the updated total number of faulty memory blocks for the memory die is less than the threshold, updating logical block addresses for the memory die. In some embodiments, the controller means is further configured for, in response to a determination that the updated total number of faulty memory blocks for the memory die is greater than the threshold identifying a second memory segment of the other memory segments having a highest number of faulty memory blocks and disability the second memory segment.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

The word "example" is used herein to mean serving as an example, instance, or illustration. Any aspect or design described herein as "example" is not necessarily to be construed as preferred or advantageous over other aspects or designs. Rather, use of the word "example" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an implementation" or "one implementation" throughout is not intended to mean the same embodiment or implementation unless described as such.

Implementations the systems, algorithms, methods, instructions, etc., described herein can be realized in hardware, software, or any combination thereof. The hardware can include, for example, computers, intellectual property (IP) cores, application-specific integrated circuits (ASICs), programmable logic arrays, optical processors, programmable logic controllers, microcode, microcontrollers, servers, microprocessors, digital signal processors, or any other suitable circuit. In the claims, the term "processor" should be understood as encompassing any of the foregoing hardware, either singly or in combination. The terms "signal" and "data" are used interchangeably.

As used herein, the term module can include a packaged functional hardware unit designed for use with other components, a set of instructions executable by a controller (e.g., a processor executing software or firmware), processing circuitry configured to perform a particular function, and a self-contained hardware or software component that interfaces with a larger system. For example, a module can include an application specific integrated circuit (ASIC), a Field Programmable Gate Array (FPGA), a circuit, digital logic circuit, an analog circuit, a combination of discrete circuits, gates, and other types of hardware or combination thereof. In other embodiments, a module can include memory that stores instructions executable by a controller to implement a feature of the module. In some embodiments, the controller 104 is implemented within the host 106 can be configured with hardware and/or firmware to perform the various functions described herein.

"Controller" shall mean individual circuit components, an application-specific integrated circuit (ASIC), a microcontroller with controlling software, a digital signal processor (DSP), a processor with controlling software, a field programmable gate array (FPGA), or combinations thereof.

Further, in one aspect, for example, systems described herein can be implemented using a general-purpose computer or general-purpose processor with a computer program that, when executed, carries out any of the respective methods, algorithms, and/or instructions described herein. In addition, or alternatively, for example, a special purpose computer/processor can be utilized which can contain other hardware for carrying out any of the methods, algorithms, or instructions described herein.

Further, all or a portion of implementations of the present disclosure can take the form of a computer program product accessible from, for example, a computer-usable or computer-readable medium. A computer-usable or computer-readable medium can be any device that can, for example, tangibly contain, store, communicate, or transport the program for use by or in connection with any processor. The medium can be, for example, an electronic, magnetic, optical, electromagnetic, or a semiconductor device. Other suitable mediums are also available.

The above-described embodiments, implementations, and aspects have been described in order to allow easy understanding of the present invention and do not limit the present invention. On the contrary, the invention is intended to cover various modifications and equivalent arrangements included within the scope of the appended claims, which scope is to be accorded the broadest interpretation to encompass all such modifications and equivalent structure as is permitted under the law.

What is claimed is:

1. A memory management method, comprising:
identifying memory segments of a memory device;
identifying, for each memory segment, a number of faulty columns;
determining a total number of faulty columns for the memory device based on the number of faulty columns for each respective memory segment;
determining whether the total number of faulty columns is greater than a threshold;
in response to a determination that the total number of faulty columns is greater than the threshold, identifying a first memory segment of the memory segments having a highest number of faulty columns; and
disabling only the first memory segment.

2. The method of claim 1, further comprising determining an updated total number of faulty columns for the memory device based on the number of faulty columns for other memory segments of the memory segments.

3. The method of claim 2, further comprising, in response to a determination that the updated total number of faulty columns for the memory device is less than the threshold, loading faulty columns of the other memory segments to a read only memory.

4. The method of claim 2, further comprising, in response to a determination that the updated total number of faulty columns for the memory device is greater than the threshold, identifying a second memory segment of the other memory segments having a highest number of faulty columns.

5. The method of claim 4, further comprising disabling the only second memory segment.

6. The method of claim 1, wherein the memory device includes 16 thousand columns.

7. The method of claim 1, wherein the memory segments include 4 thousand columns.

8. The method of claim 1, wherein identifying, for each memory segment, the number of faulty columns includes identifying, during performance of a built-in self-test operation, the number of faulty columns for each memory segment.

9. A controller, comprising:
a bus interface in communication with one or more memory blocks of a memory system; and
a processor configured to:
identify memory segments of a memory block of the one or more memory blocks;
identify, for each memory segment, a number of faulty columns;
determine a total number of faulty columns for the memory block based on the number of faulty columns for each respective memory segment;
determine whether the total number of faulty columns is greater than a threshold;
in response to a determination that the total number of faulty columns is greater than the threshold, identify a first memory segment of the memory segments having a highest number of faulty columns; and
disable only the first memory segment.

10. The controller of claim 9, wherein the processor is further configured to determine an updated total number of faulty columns for the memory block based on the number of faulty columns for other memory segments of the memory segments.

11. The controller of claim 10, wherein the processor is further configured to, in response to a determination that the updated total number of faulty columns for the memory block is less than the threshold, load faulty columns of the other memory segments to a read only memory.

12. The controller of claim 10, wherein the processor is further configured to, in response to a determination that the updated total number of faulty columns for the memory block is greater than the threshold, identify a second memory segment of the other memory segments having a highest number of faulty columns.

13. The controller of claim 12, wherein the processor is further configured to only disable the second memory segment.

14. The controller of claim 9, wherein the memory block includes four memory segments.

15. The controller of claim 9, wherein a capacity of the memory block is adjusted in response to the first memory segment being disabled.

16. The controller of claim 9, wherein the processor is further configured to identify, during performance of a built-in self-test operation, the number of faulty columns for each memory segment.

17. A memory management system, comprising:
a memory die including a plurality of planes; and
controller means in communication with the at least one memory die, the controller means configured for:
identifying memory segments of each plane of the plurality of planes;
identifying, for each memory segment, a number of faulty memory blocks;
determining a total number of faulty memory blocks for the memory die based on the number of faulty memory blocks for each respective memory segment;
determining whether the total number of faulty memory blocks is greater than a threshold;
in response to a determination that the total number of faulty memory blocks is greater than the threshold, identifying a first memory segment of the memory segments having a highest number of faulty memory blocks; and
disabling only the first memory segment.

18. The memory management system of claim 17, wherein the controller means is further configured for determining an updated total number of faulty memory blocks for the memory die based on the number of faulty memory blocks for other memory segments of the memory segments.

19. The memory management system of claim 18, wherein the controller means is further configured for, in response to a determination that the updated total number of faulty memory blocks for the memory die is less than the threshold, updating logical block addresses for the memory die.

20. The memory management system of claim 18, wherein the controller means is further configured for, in response to a determination that the updated total number of faulty memory blocks for the memory die is greater than the threshold:
identifying a second memory segment of the other memory segments having a highest number of faulty memory blocks; and
disabling only the second memory segment.

* * * * *